United States Patent
Haneda

(10) Patent No.: US 9,424,892 B2
(45) Date of Patent: Aug. 23, 2016

(54) STORAGE DEVICE TO WHICH MEMORY DEVICE ARE CONNECTABLE IN MULTIPLE STAGES

(71) Applicant: FUJITSU LIMITED, Kawasaki-shi, Kanagawa (JP)

(72) Inventor: Terumasa Haneda, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 186 days.

(21) Appl. No.: 14/219,068

(22) Filed: Mar. 19, 2014

(65) Prior Publication Data

US 2014/0298086 A1    Oct. 2, 2014

(30) Foreign Application Priority Data

Mar. 28, 2013 (JP) .................................. 2013-070261

(51) Int. Cl.
*G06F 11/00* (2006.01)
*G11C 7/10* (2006.01)

(52) U.S. Cl.
CPC .............. *G11C 7/10* (2013.01); *G11C 7/1003* (2013.01)

(58) Field of Classification Search
CPC ............ H04L 12/437; H04L 12/445; H04L 2001/0097; H04L 41/0659
USPC .................................................. 714/4.2, 6.3
See application file for complete search history.

(56) References Cited

U.S. PATENT DOCUMENTS

| | | | | |
|---|---|---|---|---|
| 6,032,266 | A * | 2/2000 | Ichinohe | H04L 41/0213 714/21 |
| 7,624,324 | B2 * | 11/2009 | Hanaoka | H04L 1/0082 714/724 |
| 8,032,793 | B2 * | 10/2011 | Haneda | G06F 11/0745 710/301 |
| 2006/0206655 | A1 * | 9/2006 | Chappell | G06F 13/4027 710/315 |
| 2008/0104341 | A1 * | 5/2008 | Ihara | G06F 13/28 711/154 |
| 2009/0150707 | A1 | 6/2009 | Drucker et al. | |
| 2009/0327645 | A1 | 12/2009 | Doi | |
| 2010/0318718 | A1 | 12/2010 | Eilert et al. | |
| 2012/0106560 | A1 * | 5/2012 | Gumaste | H04L 45/04 370/401 |

FOREIGN PATENT DOCUMENTS

| | | |
|---|---|---|
| JP | 2010-287203 | 12/2010 |
| JP | 2012-18639 | 1/2012 |
| JP | 5056845 | 10/2012 |

\* cited by examiner

*Primary Examiner* — Elmira Mehrmanesh
(74) *Attorney, Agent, or Firm* — Fujitsu Patent Center

(57) ABSTRACT

A storage device includes a controller device and a memory device. The controller device transmits communication information to which route information is added, the route information indicating a route to a destination of the communication information and including an address of a relay point that the communication information passes through before reaching the destination of the communication information. The memory device receives the communication information, and to transmit the communication information to a next relay point, when the destination of the communication information is not the local memory device, by using the address of the relay point included in the route information of the communication information.

10 Claims, 26 Drawing Sheets

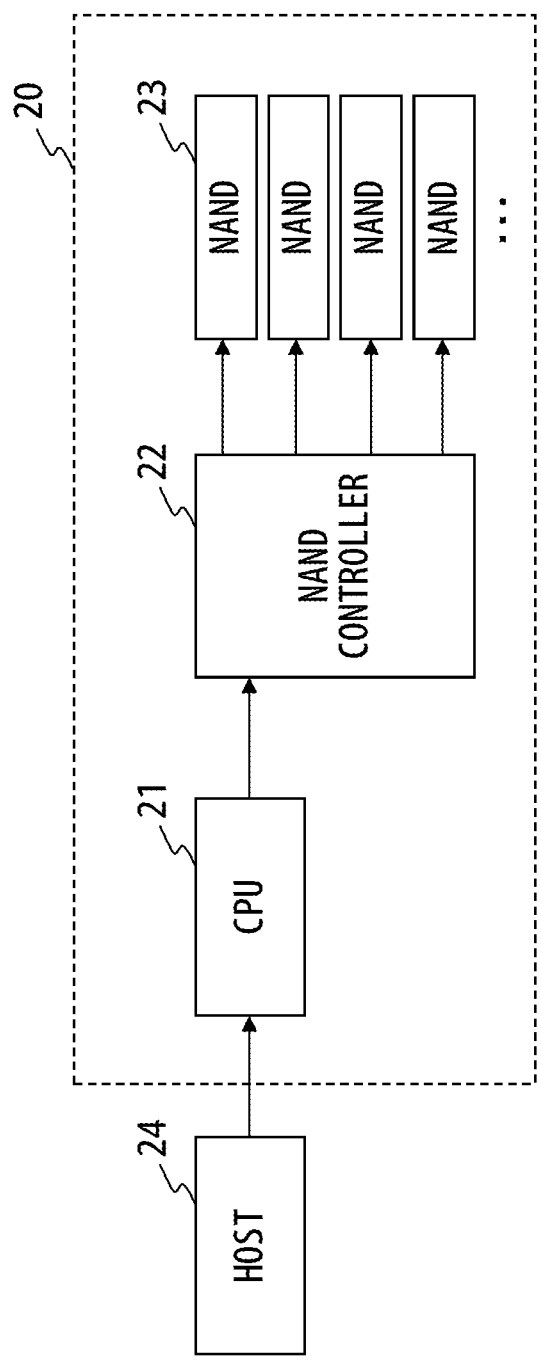
F I G. 2

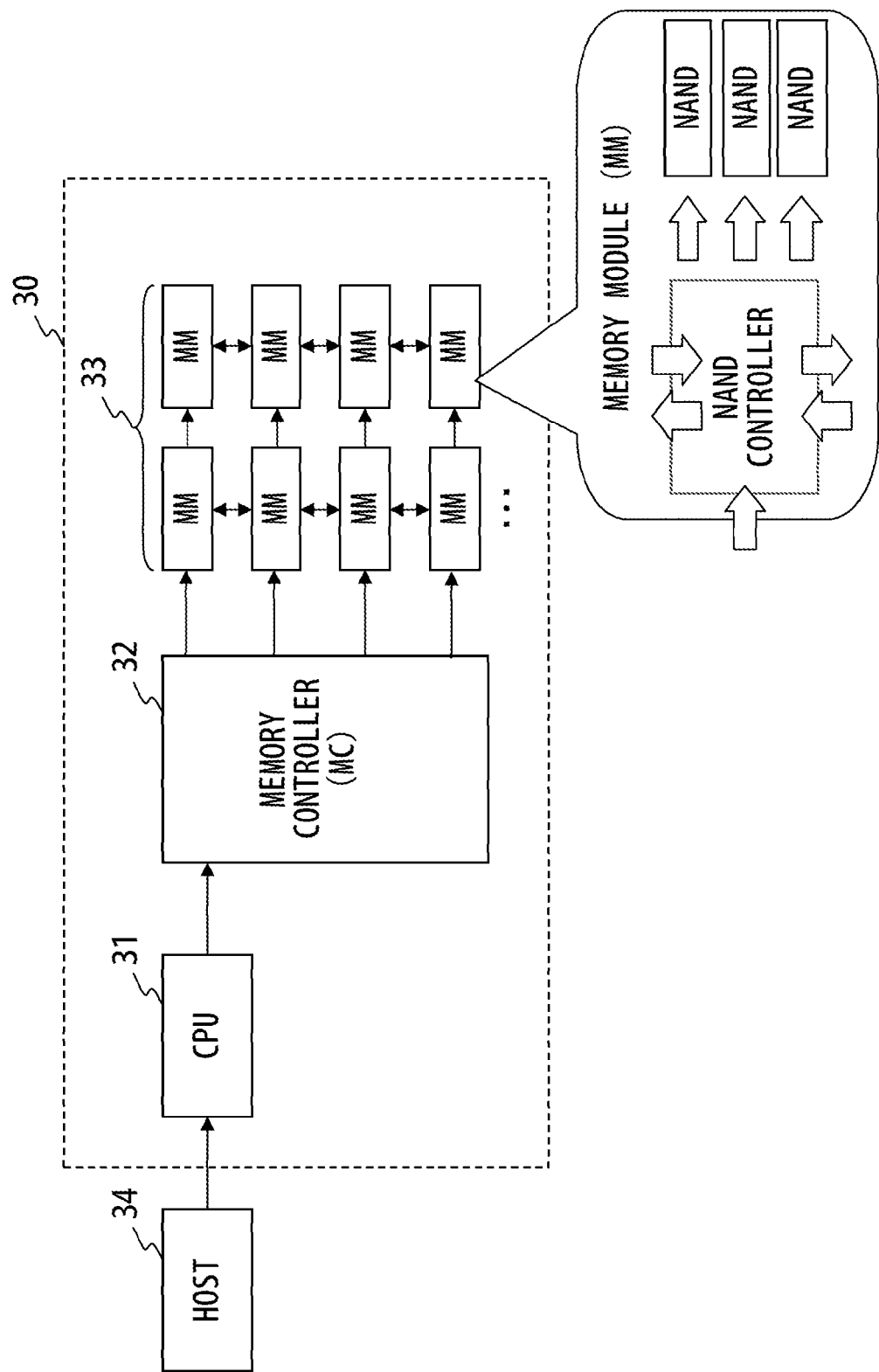
F I G. 3

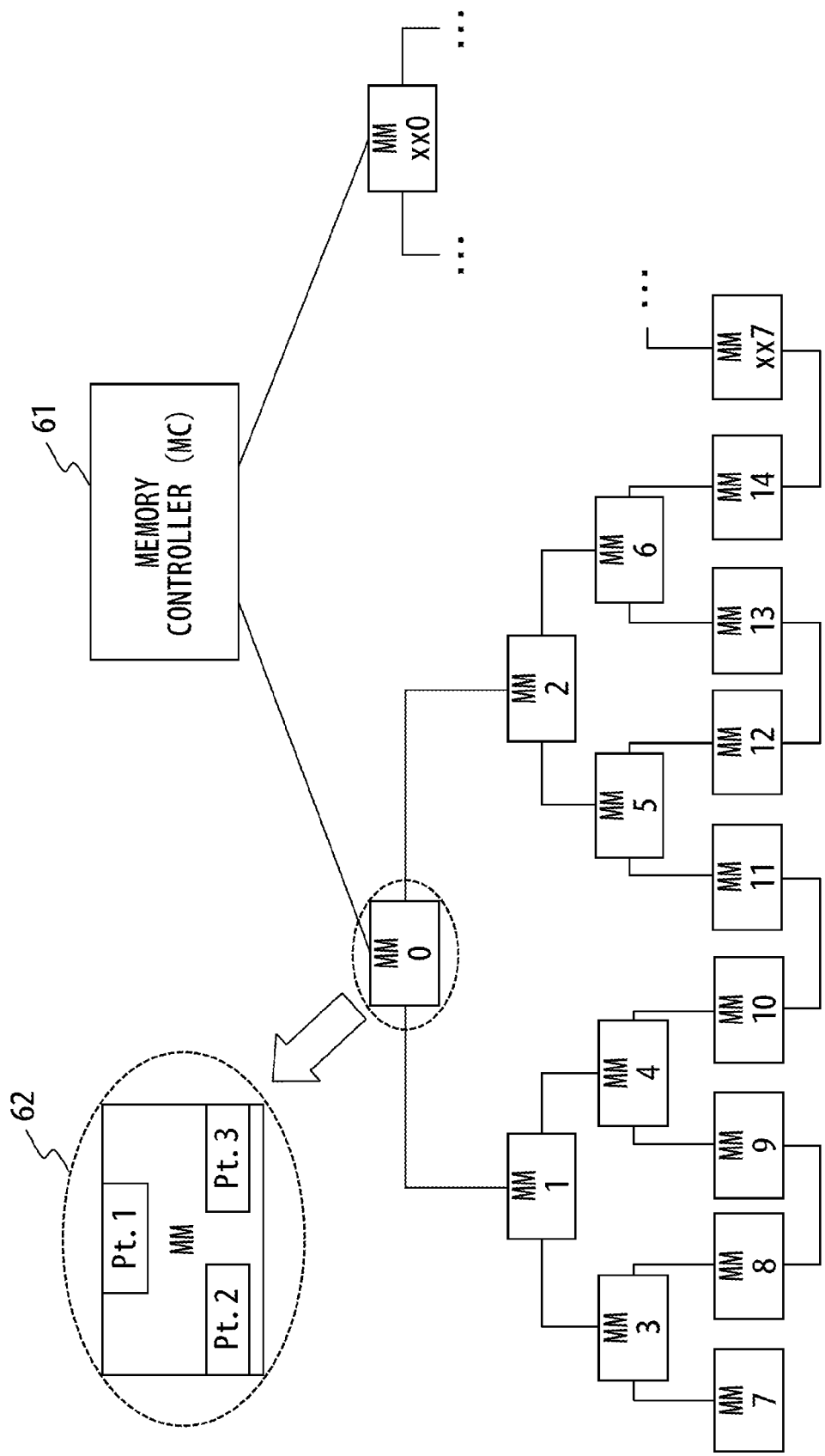
F I G. 6

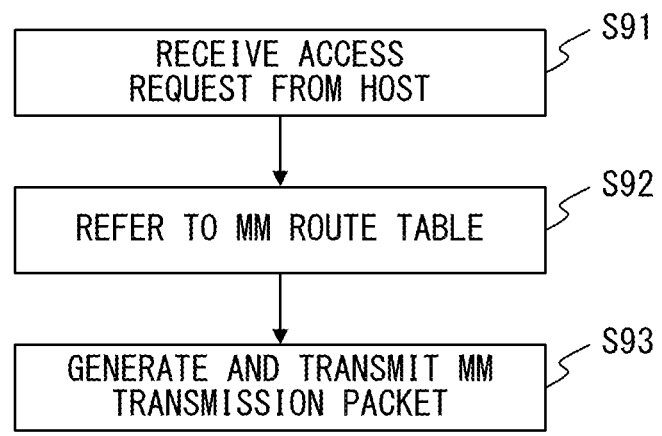
F I G. 9

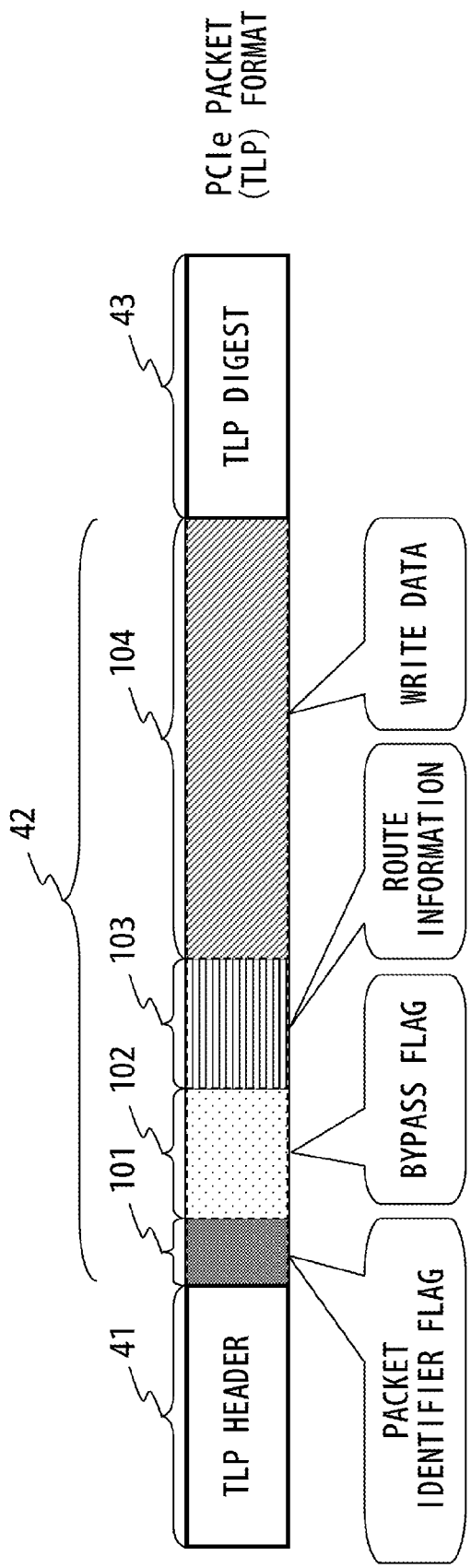
F I G. 10A
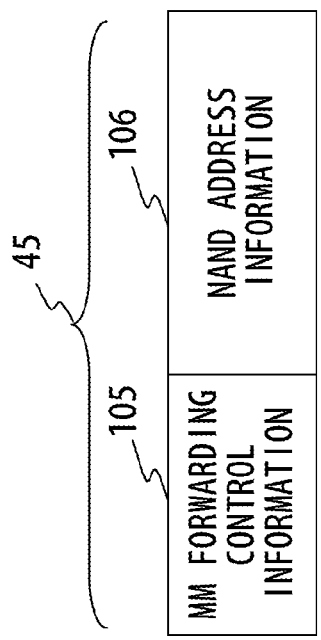
F I G. 10B

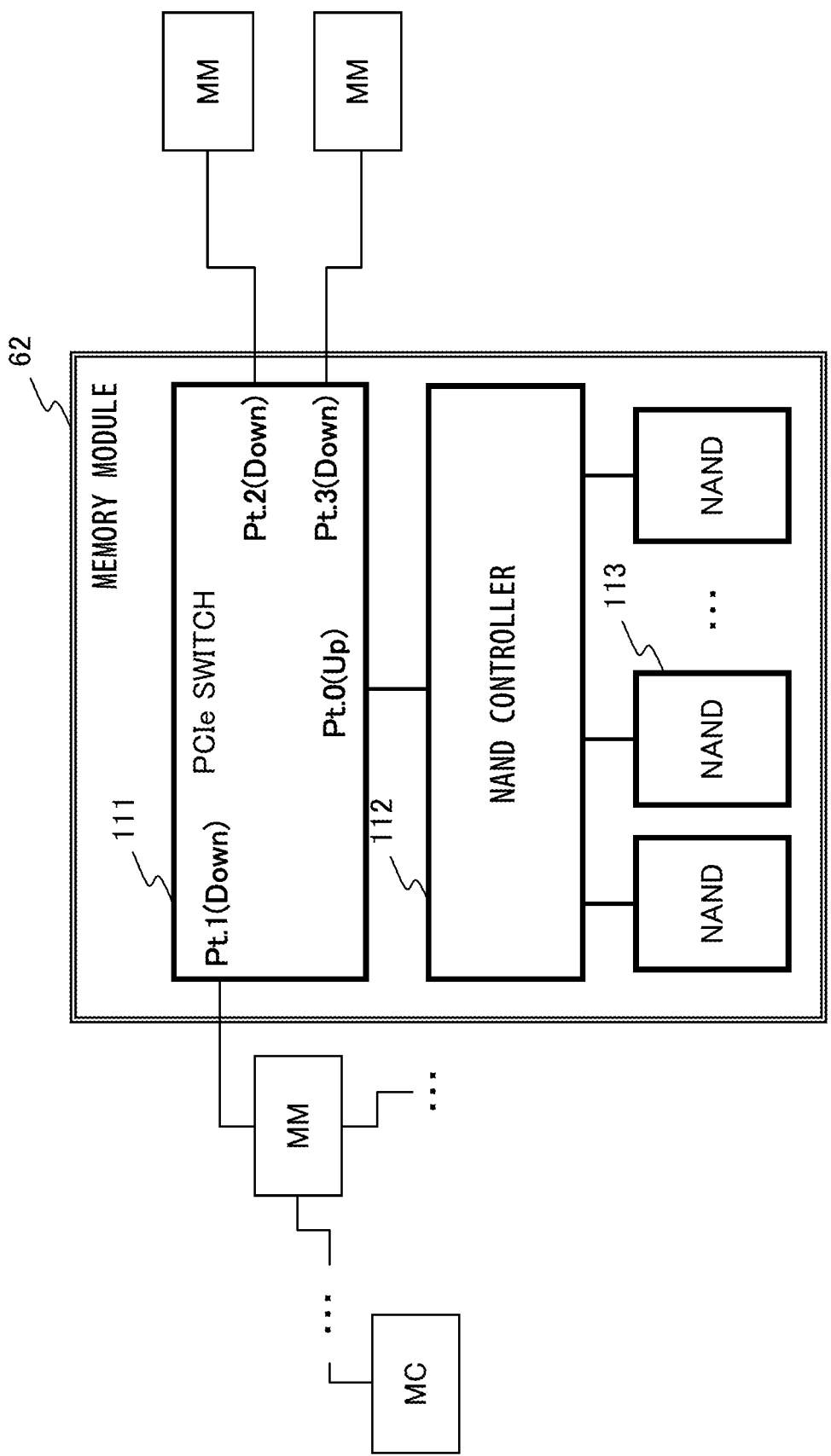
F I G. 11

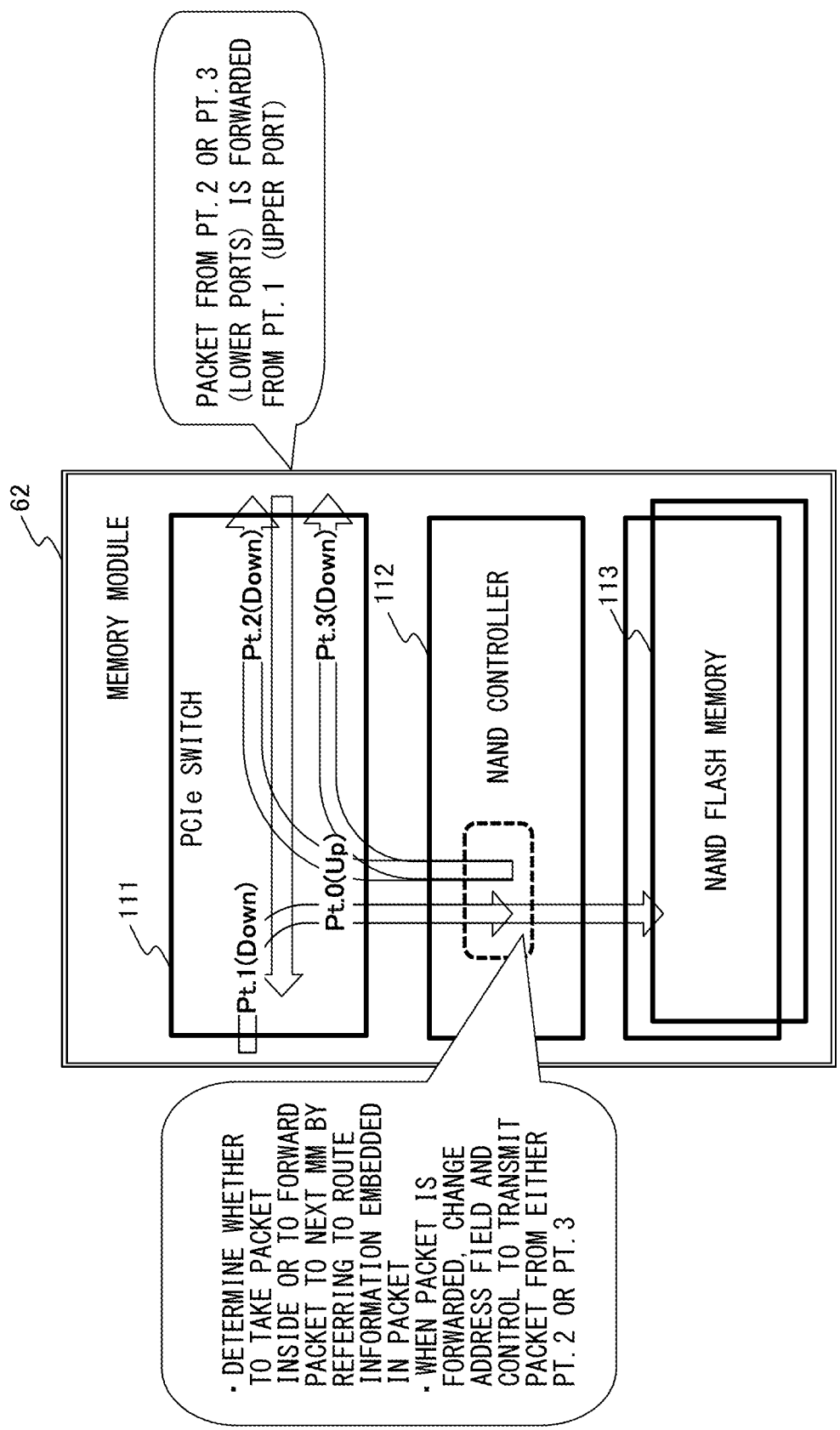
F I G. 13

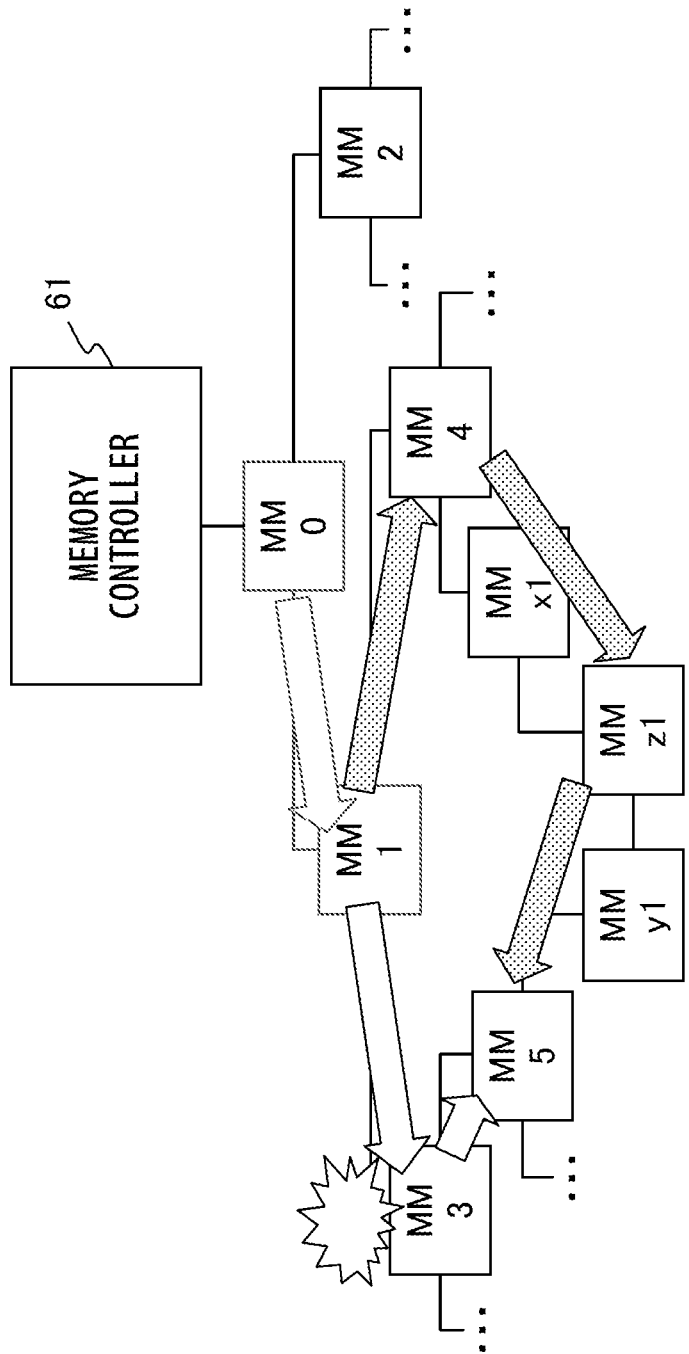
F I G. 18

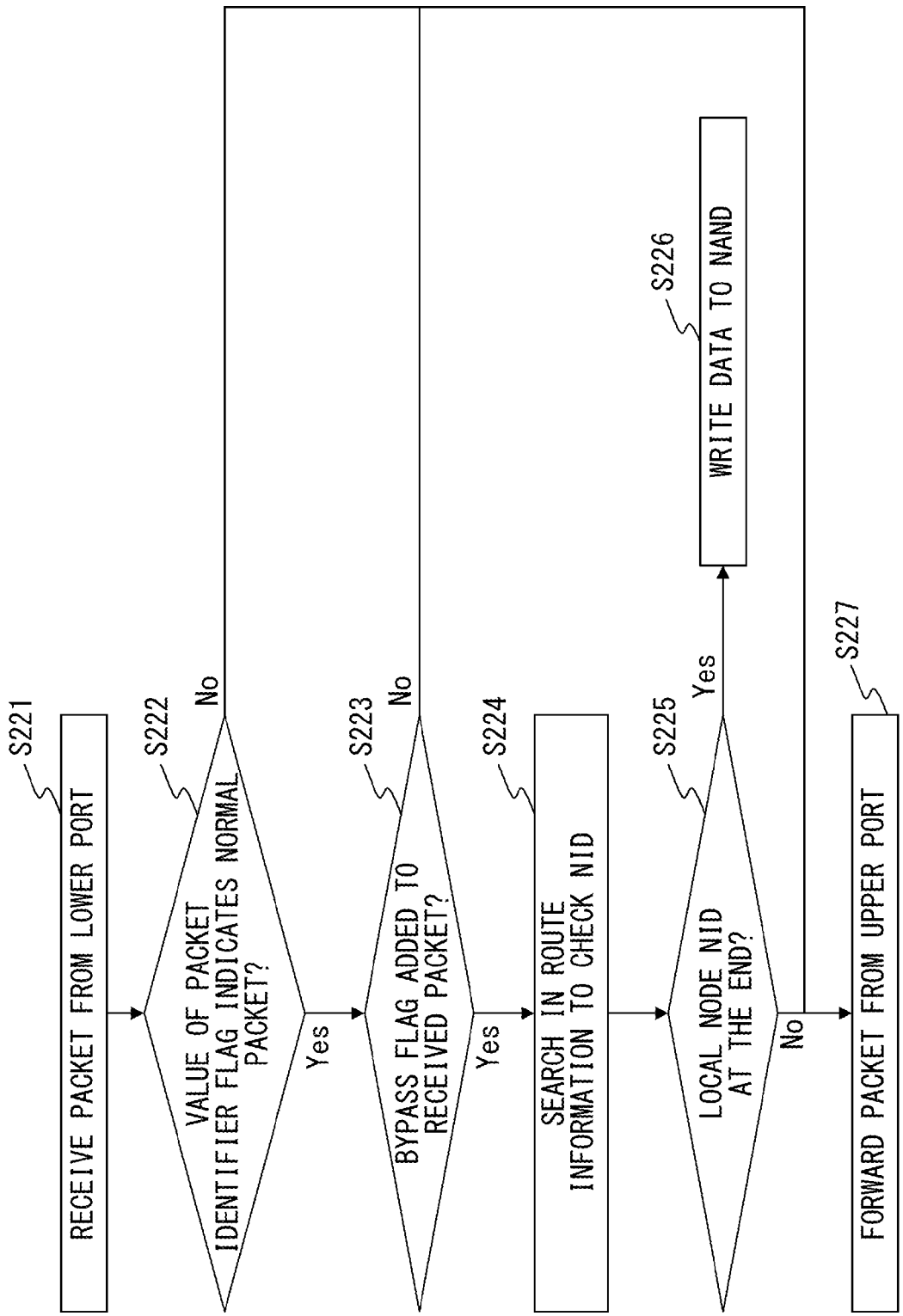
F I G. 22

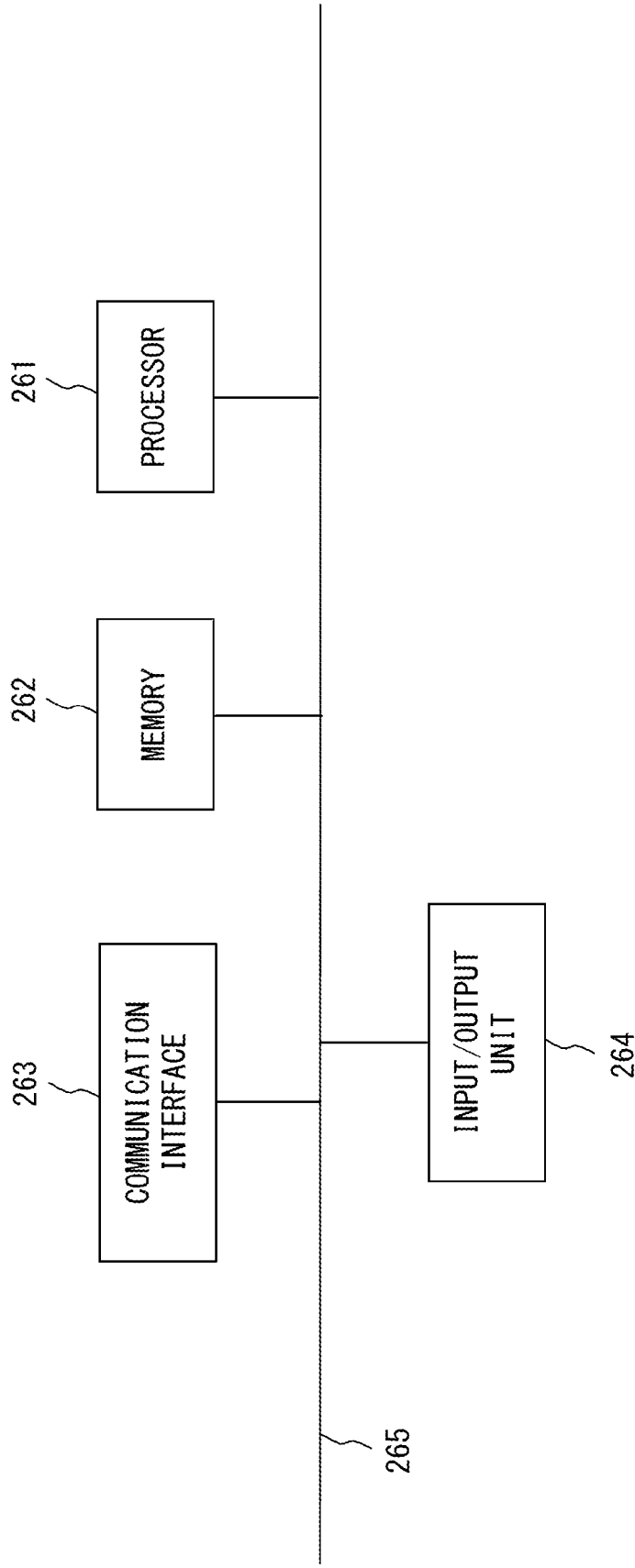
F I G. 26

STORAGE DEVICE TO WHICH MEMORY DEVICE ARE CONNECTABLE IN MULTIPLE STAGES

CROSS-REFERENCE TO RELATED APPLICATION

This application is based upon and claims the benefit of priority of the prior Japanese Patent Application No. 2013-070261, filed on Mar. 28, 2013, the entire contents of which are incorporated herein by reference.

FIELD

The present invention relates to a storage device.

BACKGROUND

A storage device having an HDD (Hard Disk Drive) as a storage medium has some disadvantages. One is that the access performance of the HDD (particularly seeking) can become bottlenecked and performance demands from users cannot be satisfied. A possible solution is to provide a cache in the storage device to improve its throughput. In such a case, however, complicated structures to protect the cache need to be provided to ensure the reliability of the device.

FIG. 1 illustrates an example of a storage device in which HDDs serve as storage media and caches are provided. The storage device 10 includes a CPU (Central Processing Unit) 11, a memory controller 12, a switch 13, an HDD 14, a cache memory (hereinafter referred to as a cache) 15, a cache mirror 16, and a cache backup 17. The storage device 10 is connected to a host 18 via a network.

The CPU 11 receives an input/output request to the storage device 10 from the host 18, and controls operations of the entire storage device. The memory controller 12 provides a structure to access a region in which target data to be accessed from the host 18 is stored. The switch 13 connects to plural HDDs 14 and relays the data exchange between the memory controller 12 and the HDDs 14. The HDDs 14 store target data to be accessed from the host 18.

The cache 15 is used to speed up data passing between the host 18 and the HDDs 14. The cache mirror 16 is provided to avoid a loss of data when a failure occurs in the cache 15, and stores data with the same content as that of the cache 15. The cache 15 and the cache mirror 16 are made up of DRAMs (Dynamic Random Access Memory).

When the cache 15 and the cache mirror 16 are made up of DRAMs, since a DRAM is a volatile memory, contents of the cache are lost when a power supply is unexpectedly stopped due to a blackout, etc. In preparation for such a case, the cache backup 17 is made up of a NAND flash memory (hereinafter referred to as NAND), which is a non-volatile memory, and functions as a cache backup at the time of unexpected power-supply disconnection.

In a storage system having HDDs as storage media as in FIG. 1, a structure of the storage system becomes complicated to ensure reliability of the system when a cache is provided to improve performance.

In view of this, there is a storage system having a structure that uses NANDs rather than HDDs as a storage medium. In this structure, input/output can be performed at higher speed than HDDs, and therefore the structure of the storage system can be simple without providing a cache to satisfy the performance demands of users.

FIG. 2 illustrates an example of the storage system made up of NANDs. The storage system 20 includes a CPU 21, a NAND controller 22, and a NAND flash memory (hereinafter referred to as NAND) 23. The storage device 20 is connected to a host 24 via a network, etc.

The CPU 21 provides the same functions as those described in FIG. 1. The NAND controller 22 is connected to plural NANDs 23 and manages the NANDs 23. For example, the NAND controller 22 performs wear leveling of the NANDs 23, defect block management, error check and correct (ECC), and logical/physical address conversion, etc. The NANDs 23 store target data to be accessed from a host.

Here, when the NANDs 23 are used as storage media, in consideration of the performance, the NANDs 23 are arranged in parallel with respect to the NAND controller 22 as illustrated in FIG. 2. Because there is a limit to the physically implementable number of the NANDs 23, the capacity of the entire storage system is limited. In this manner, the storage system in FIG. 2 is inferior to the structure with HDDs in the aspect of packaging density.

There is a method to improve the packaging density by making a multistage connection of modules controlling small-capacity NANDs to form a tree or a mesh. FIG. 3 illustrates an example of a storage device in which modules controlling small-capacity NANDs are connected in multiple stages. A storage system 30 includes a CPU 31, a memory controller 32, and a memory module 33 (this may be denoted as MM in the drawings or the following descriptions). The storage device 30 is connected to a host 34 via a network etc.

The CPU 31 provides the same functions as those described in FIG. 1. The memory controller 32 provides a structure to access a region in which target data to be accessed from the host 34 is stored. The memory module 33 includes a NAND controller and NANDs and provides the same functions as those of the NAND controller 22 and the NANDs 23 explained in FIG. 2.

In FIG. 3, the memory module 33 is provided with through paths connecting to other memory modules in addition to access paths to NANDs connected to the memory module 33 itself.

As a method that allows multistage connection of a set of memory modules as illustrated in FIG. 3, there is a method in which a protocol is uniquely defined and set.

It should be noted that technologies described in each of the following documents have been known. US Patent Application Publication No. 2009/0150707 Japanese Laid-Open Patent Publication No. 2010-287203 Japanese Laid-Open Patent Publication No. 2012-18639

According to an aspect of the embodiment, an storage device includes a controller device configured to transmit communication information to which route information is added, the route information indicating a route to a destination of the communication information and including an address of a relay point that the communication information passes through before reaching the destination of the communication information and a memory device configured to receive the communication information, and to transmit the communication information to a next relay point, when the destination of the communication information is not the local memory device, by using the address of the relay point included in the route information of the communication information.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2 illustrates an example of the storage system made up of NANDs;

FIG. 3 illustrates an example of a storage device in which modules controlling small-capacity NANDs are connected in multiple stages;

FIG. 6 is a diagram illustrating an example of connection configurations between memory modules in the storage device according to the present embodiment;

FIG. 9 illustrates an operation flow of a memory controller;

FIG. 10A illustrates an example of a packet transmitted/received in the storage device according to the present embodiment;

FIG. 10B illustrates a structure of data stored in the address field 45 of a packet in the present embodiment;

FIG. 11 illustrates an example of a configuration of a memory module;

FIG. 13 is a diagram (1) to explain states of the forwarding processing of the NAND controller;

FIG. 18 is a diagram to explain a state in which packets are set to go a bypass route when an abnormality occurred in a route between memory modules;

FIG. 22 illustrates an operation flow of a memory module at the time of receiving a packet from a lower port;

FIG. 26 illustrates an example of a hardware configuration of the memory controller and the NAND controller according to the present embodiment.

DESCRIPTION OF EMBODIMENTS

The method that uniquely defines a protocol increases the development lead time (cost, man-hours). The storage device according to the present embodiments can reduce the workload required to enable a multistage connection of a group of memory modules to the storage device.

Figure 1:
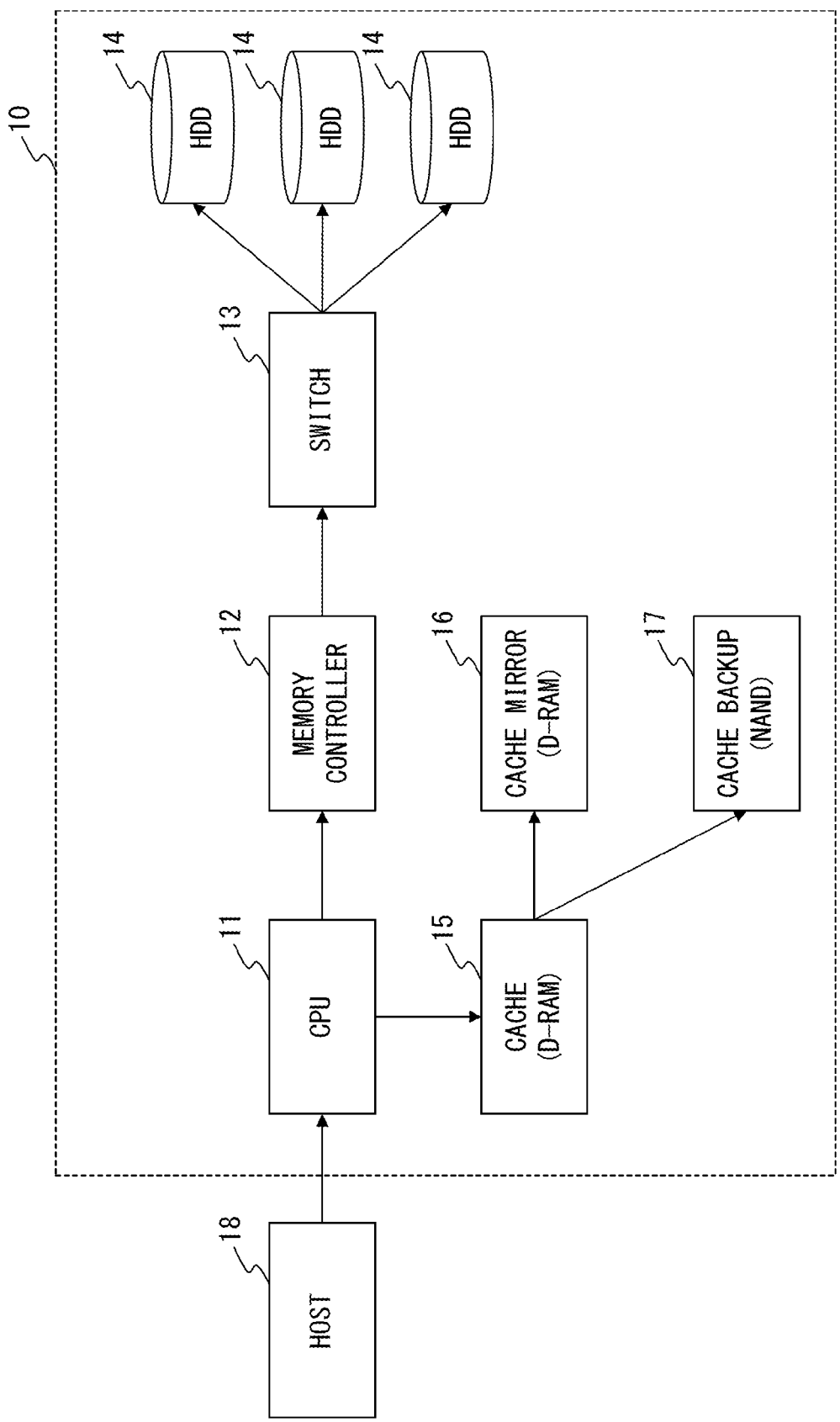
FIG. 1 illustrates an example of a storage device in which HDDs serve as storage media and caches are provided.
Figure 4:
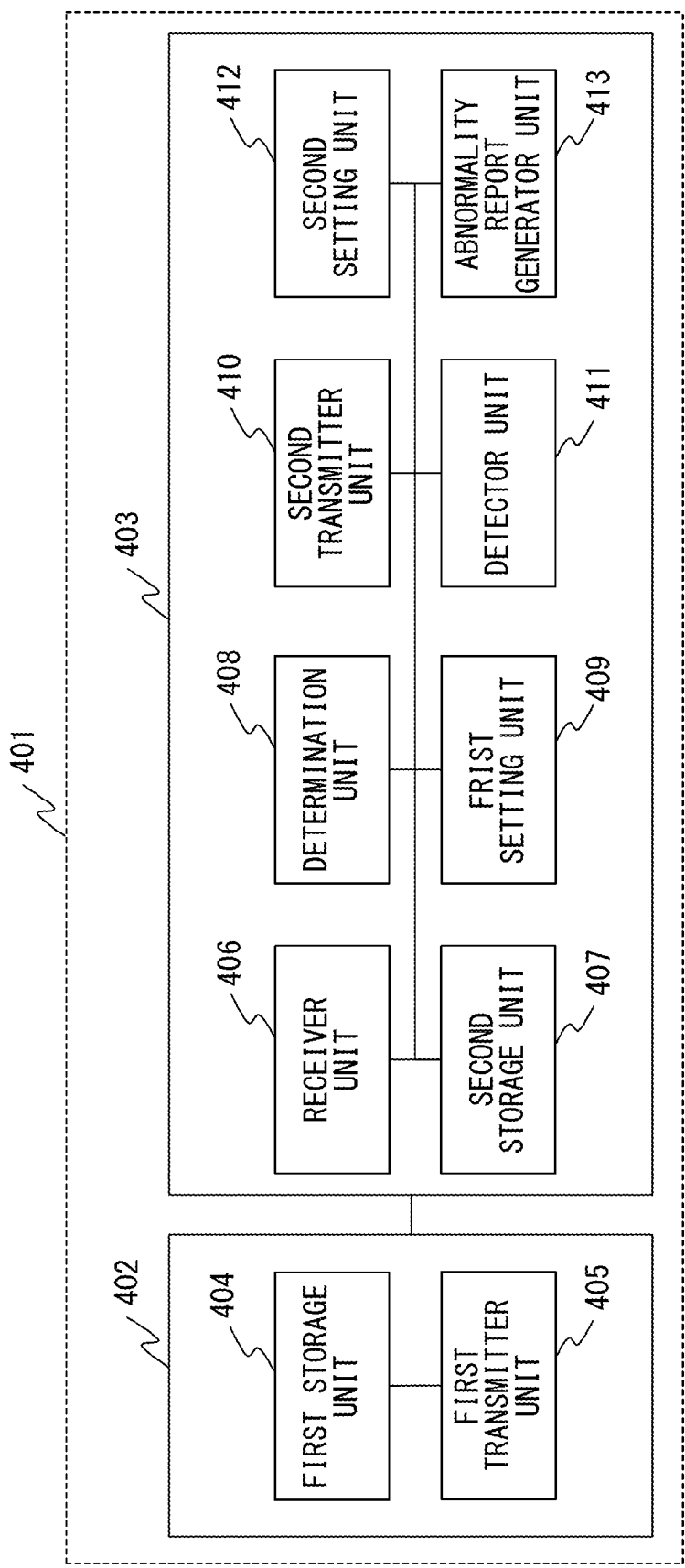
FIG. 4 illustrates an example of configurations of a storage device according to the present embodiments.

FIG. 4 illustrates an example of configurations of a storage device according to the present embodiments.

A storage device 401 includes a controller device 402 and plural memory devices 403. The controller device 402 transmits communication information to which route information is added, and the route information indicates a route to a destination of the communication information and includes addresses of relay points that the communication information passes through before reaching the destination. Each of the memory devices 403 receives the communication information and when the communication information is not addressed to the local memory device itself, the memory device 403 transmits the communication information to the next relay point by using the relay point addresses included in the route information of the communication information.

The controller device 402 includes a first storage unit 404 and a first transmitter unit 405.

The first storage unit 404 stores communication information to which route information is added and the route information indicates a route to a destination of the communication information and includes addresses of relay points that the communication information passes through before reaching the destination.

The first transmission unit 405 adds the route information to a payload section of the communication information and transmits the communication information.

Each of the memory devices 403 includes a receiver unit 406, a second storage unit 407, a determination unit 408, a first setting unit 409, a second transmitter unit 410, a detector unit 411, a second setting unit 412, and an abnormality report generator unit 413.

The receiver unit 406 receives the communication information having the route information added to its payload section.

The second storage unit 407 stores association information that is information to associate identification information of another memory device connected to the local device with a port number of a port connected to the another memory device.

The determination unit 408 determines whether or not the communication information is addressed to the local memory device on the basis of the route information.

The first setting unit 409, when it is determined that the communication information is not addressed to the local device, obtains from association information a port number associated with the identification information of the next relay point included in the route information, and sets the obtained port number to a header section of the communication information.

The second transmitter unit 410 transmits the communication information from the port corresponding to the port number set in the header section. The second transmitter unit 410 also makes a change in a port to which the communication information is transmitted when bypass information is set in the communication information. In addition, when bypass information is set to the communication information, the second transmitter unit 410 makes a change in a port to which the communication information is transmitted in accordance with the bypass information and the port from which the receiver unit 406 received the communication information. The second transmitter unit 410 makes a change in a port to transmit the communication information when the communication information stores abnormality information.

The detector unit 411 detects an occurrence of abnormality in the next relay point or in a route to the next relay point.

The second setting unit 412 sets to the payload section of the communication information bypass information to cause the communication information to bypass, when abnormality is detected.

The abnormality notice generator unit 413 generates communication information when abnormality is detected and adds the abnormality information indicating the occurrence of abnormality to the payload section of the generated communication information.

The controller device 402 and the plural memory devices 403 are connected in such a connection configuration that in a graph in which an identification number is assigned to each node of a binary tree in the breadth-first search order and leaf nodes that have a difference in the identification information being 1 and that do not have an identical parent node are connected, the controller device is allocated to a root node of the binary tree and each of the plurality of memory nodes is allocated to each node other than the root node.

In the present embodiment, a general-purpose protocol is used to enable multistage connection of the group of memory modules to the storage device. As a result, a process to define a unique protocol to make a multistage connection of the memory module group can be eliminated.

A general-purpose protocol used in PCI Express (hereinafter referred to as PCIe) is used as the general-purpose protocol in the present embodiment. The PCIe has such an aspect that its protocol is easily incorporable into devices since the PCIe packaged as IP (Intellectual Property) is sold by each vender.

The general-purpose protocol of the PCIe is not a protocol suitable for a structure of the multistage connection of memory modules as in the example in FIG. 3. This is because of the structure in the general-purpose protocol of the PCIe. Next, the structure of the general-purpose protocol of the PCIe is explained with reference to FIGS. 5A-5C and a reason that the general-purpose protocol of the PCIe is a protocol not suitable for multistage connection is also explained.

Figure 5:
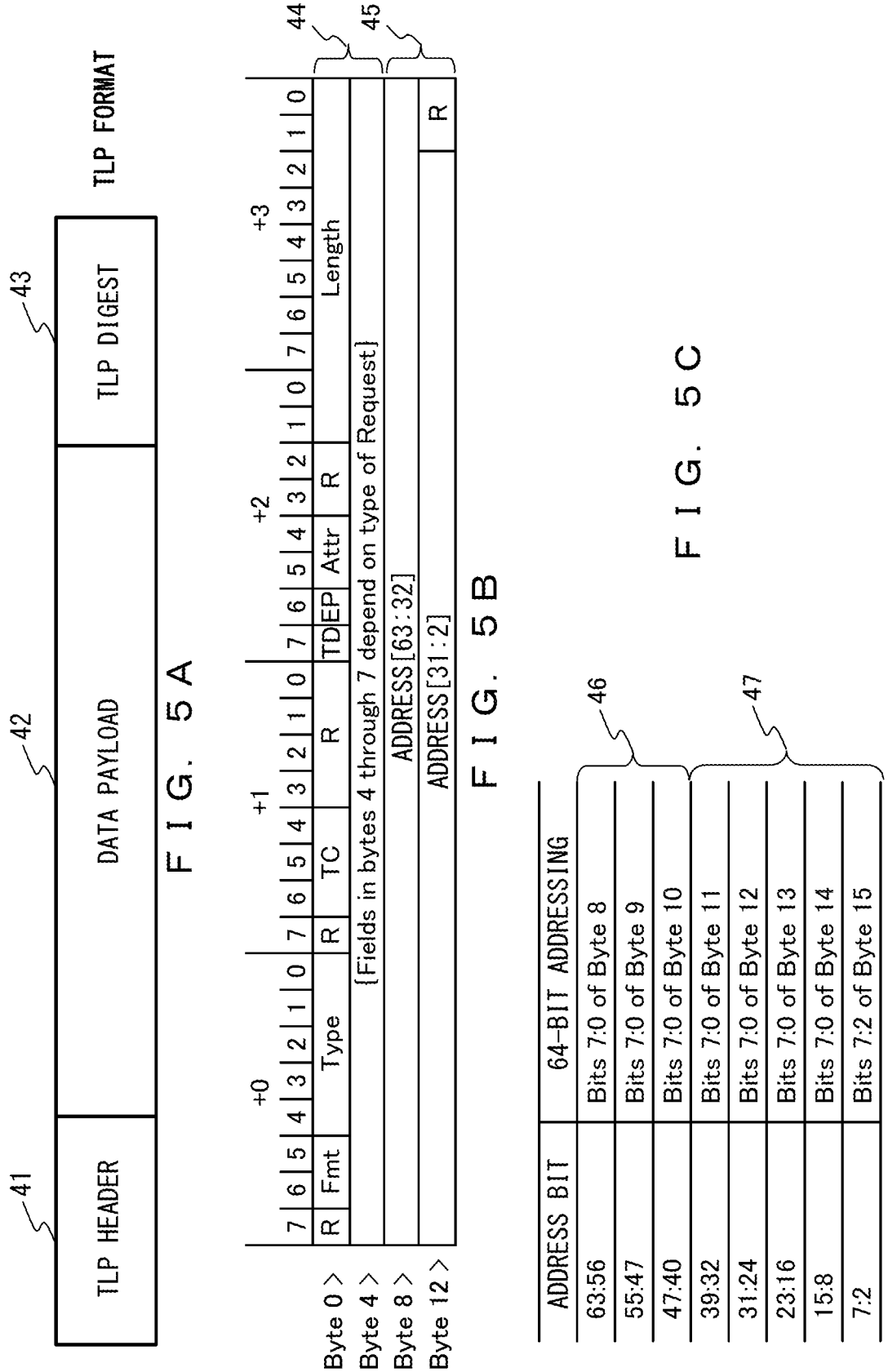
FIG. 5A illustrates a format of a packet of the PCIe.
FIG. 5B illustrates a format of the TLP header 41.
FIG. 5C is a diagram to explain the state of the address field 45 when 40 bits are ensured for the address field 45 to designate a local memory address in each memory module.

FIG. 5A is a diagram illustrating a format of a packet of the PCIe. The example in FIGS. 5A-5C represents a packet of a transaction layer of the PCIe, and in the following explanations, this packet is referred to as a TLP (Transaction Layer Packet). A TLP includes three fields: a TLP header 41, a data payload 42, and a TLP digest 43.

The TLP header 41 stores information such as a command type and address. The data payload 42 stores real data of the TLP that excludes management information such as the TLP header 41 and the TLP digest 43. The TLP digest 43 is an option field and stores data for error detection or recovery.

FIG. 5B illustrates a format of the TLP header 41. As illustrated in FIG. 5B, the TLP header 41 includes a control information field 44 of the upper 8 bytes (including a reserved region) and an address field 45 of the lower 8 bytes (including a reserved region). The control information field 44 includes information such as a format, a type, and a length.

The address field 45 stores an address of a packet destination. Here, in the case of the multistage connection of memory modules as in FIG. 3, when each memory module has a memory capacity of about 1 TB (terabyte), the address field 45, which is needed to designate a local memory address in each memory module has to have about 40 bits.

FIG. 5C is a diagram to explain the state of the address field 45 when 40 bits are ensured for the address field 45 to designate a local memory address in each memory module. In FIG. 5C, an upper address field 46 stores address information (hereinafter referred to as a memory module address) to identify a memory module to be accessed in the connection configuration of the memory modules of the storage device. More specifically, the memory module address represents, for example, a switch port number in each memory module in units of bytes. A lower address field 47 stores address information (hereinafter referred to as a local address) to designate an address of an NAND region connected to the memory module indicated in the upper address field 46.

When 40 bits are reserved for the lower address field 47, 24 bits remaining in the address field 45 are reserved for the upper address field 46. In such a case, information of only three ports can be kept in the upper address field 46. For that reason, the maximum coupling number of the memory modules is about three. In this manner, the general-purpose protocol of the PCIe is not suitable for the multistage connection of memory modules.

In the general-purpose protocol of the PCIe, packet types are specified to be memory read, memory write, and so on.

In the present embodiment, accesses between the memory controller and a NAND are made on the basis of packet exchange packets of the memory write (Memory. Wt.). In other words, even for the memory read requests, memory write packets are the basic packets used in the present embodiment. As a result, a configuration based on the PCIe can be realized in the configuration of memory modules connected in a multistage form.

Here, in the general-purpose protocol of the PCIe, the type is not specified for a response to reception of a memory write packet. Therefore the general-purpose protocol of the PCIe does not ensure the delivery of write data to a target. However, in the present embodiment, a memory module returns a response packet when a memory write packet is received. As a result, it is possible to ensure delivery of the written data to the target. Packet response operations are explained later.

Next, a configuration of memory module connection in the storage device according to the present embodiment is explained. FIG. 6 is a diagram illustrating an example of connection configurations between memory modules in the storage device according to the present embodiment.

As illustrated in FIG. 6, the connection configuration in the storage device is a tree structure (a binary tree) having a memory controller 61 at the top (root) and the individual nodes other than the top are memory modules 62. Here, each of the memory modules 62, which serves as each node, has a unique identification number, and the identification numbers are assigned sequentially from the memory controller 61 at the top in the breadth-first search order. However, unlike a tree structure, memory modules 62 that are leaf nodes at the bottom-most positions of the tree structure in this connection configuration are connected to the adjacent leaf node memory modules 62. In other words, each of the memory modules 62 that are leaf nodes at the bottom-most positions of the tree structure are connected to a memory module with the following conditions. The conditions for the memory module to be connected are a memory module that is 1 number different in the identification number, that is located at the bottom-most position, and that does not have the same parent node. More specifically, in the example of FIG. 6, MM8 and MM9 are connected to each other, MM10 and MM11 are connected to each other, . . . and so on. Here, each of the nodes is connected on the basis of PCIe.

It should be noted that two or more memory modules may be directly connected to the memory controller 61. In such a case, however, sub-trees of a top memory module directly connected to the memory controller 61 have a binary tree configuration.

In the following descriptions, memory modules 62 may be simply described as nodes in the explanations relating to a connection configuration between memory modules 62.

As illustrated in FIG. 6, each memory module 62 in the present embodiment has three ports connected to other memory modules 62. A port 1 (PT.1) is connected to a parent node, and a port 2 (PT.2) and a port 3 (PT.3) are connected to a child node or a node in the same depth level. More specifically, in internal nodes, which are nodes other than the bottommost nodes, the port 2 is connected to a node with a smaller identification number of the child nodes, and the port 3 connects to a node with a larger identification number of the child nodes. When a target node is denoted by node A, the port 2 of the node A is connected to a node of the bottommost nodes, which has an identification number that is smaller than the identification number of the node A by 1. Alternately, the port 3 of the node A is connected to a node of the bottommost nodes, which has an identification number that is larger than the identification number of the node A by 1. Here, since the bottommost nodes are not connected to a node that shares the same parent node, one or both of the port 2 and port 3 are not connected. For example, MM8 is connected to MM9 through the port 3, and MM9 is connected to MM8 through the port 2. The port 2 and the port 3 of MM7 are not connected to each other.

In the following descriptions, the port 1 connected to a parent node may be referred to as an upper port and the port 2 and the port 3 connected to a child node or a node in the same depth level may be referred to as a lower port.

It should be noted that the memory controller 61 corresponds to the controller device 402. In addition, the memory module 62 corresponds to the memory device 403.

Next, a state is explained in which a packet is transmitted to an NAND in the memory module 62 from the memory controller 61.

Figure 7:
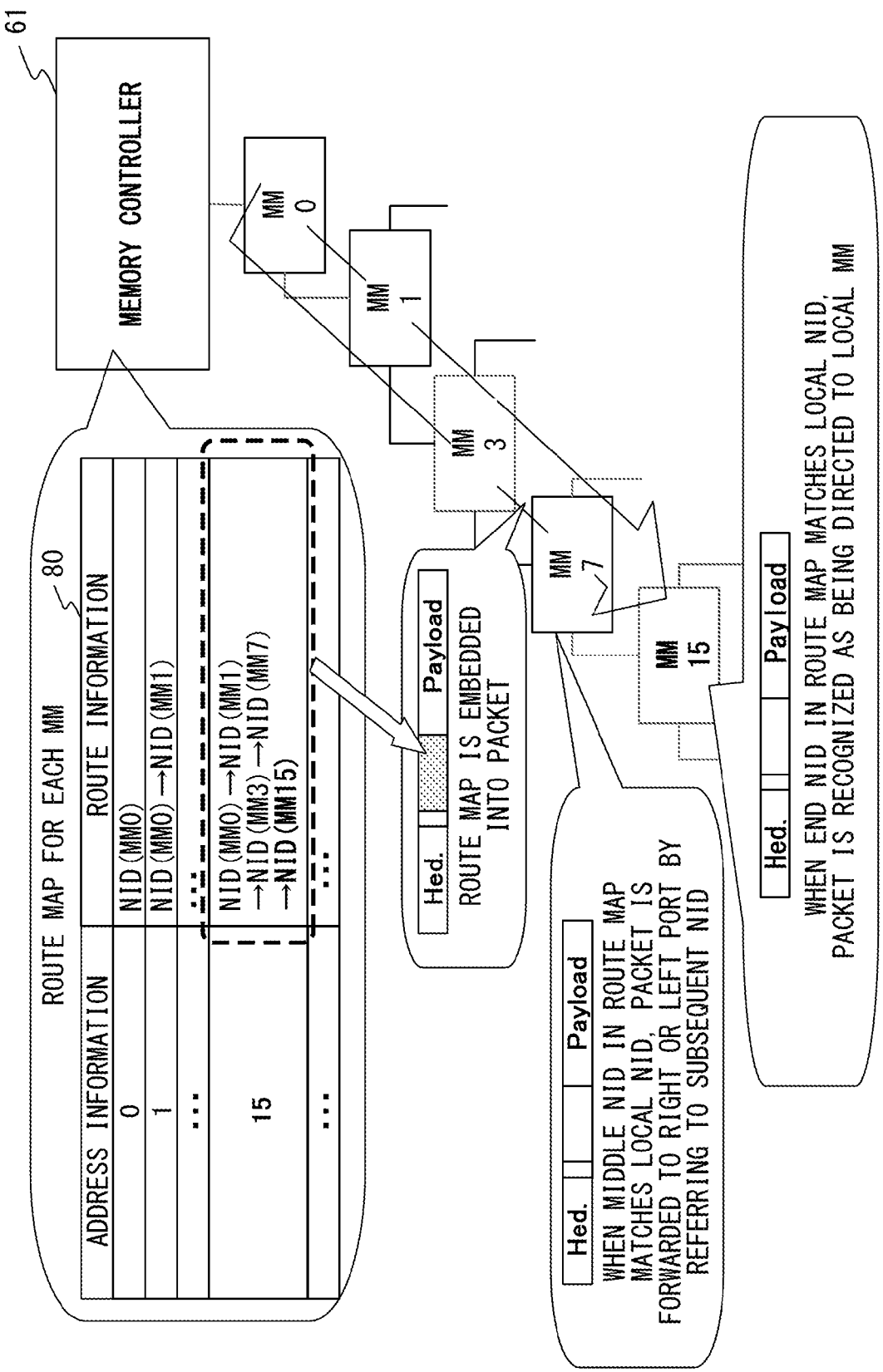
FIG. 7 is a diagram to explain a state in which a packet is transmitted from a memory controller to an NAND in a memory module in the present embodiment.

FIG. 7 is a diagram to explain a state in which a packet is transmitted from a memory controller to an NAND in a memory module in the present embodiment. The example in FIG. 7 is an example in which a packet is transmitted from a memory controller 61 to an MM 15.

The memory controller 61 has a route map 80, which records in advance routes to each memory module 62, stored in a storage unit of the memory controller 61. The memory controller 61 identifies a route to a packet destination by using the route map 80, embeds route information 82 into the data payload of the packet, and transmits the packet. The route information 82, which is explained in detail later, is information having identification numbers (also referred to as NID hereinafter) of memory modules 62, which are located on the route from the memory controller 61 to the addressed memory module 62, arranged in sequence.

In the example of FIG. 7, operations when the MM7 and the MM15 receive a packet are explained. When the MM7 receives a packet, the MM7 checks the route information 82 embedded into the packet. When the MM7 confirms that its own NID, i.e., MM7, is included in the middle of the route information 82, the MM7 forwards the packet to the MM15 that is a memory module 62 of the NID written subsequent to the MM7. When the MM15 receives the packet from the MM7, the MM15 refers to the route information 82 embedded into the packet. The MM15 confirms that MM15, i.e., its own NID, is written at the end of the route information 82. The MM15, then, recognizes that the received packet is a packet directed to the MM15.

Figure 8:
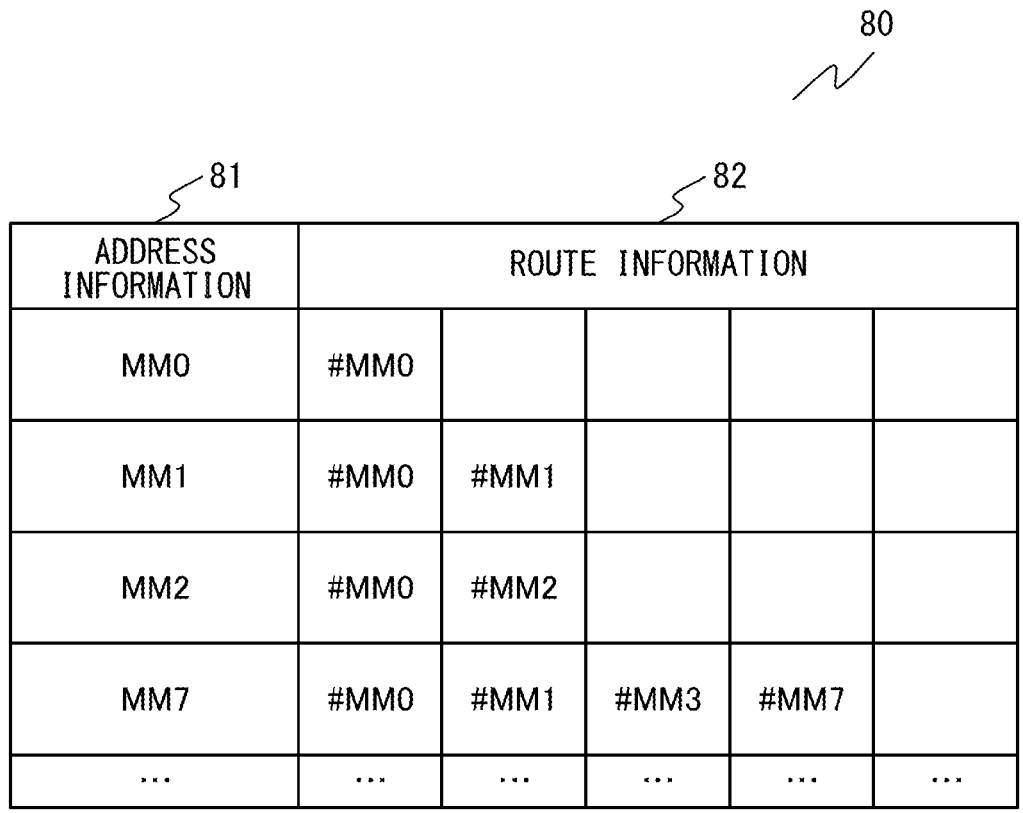
FIG. 8 illustrates an example of a data structure of a route map for the memory controller to identify a destination route of a packet.

FIG. 8 illustrates an example of a data structure of a route map for the memory controller to identify a destination route of a packet.

The route map 80 includes data items of address information 81 and the route information 82. The address information 81 is information indicating addressed memory modules 62 indicated by the identification numbers of the memory modules 62 included in the storage device. In the route information 82, route information 82 from the memory controller 61 to a memory module 62 indicated in the address information 81 (hereinafter referred to addressed memory module) is stored. The route information 82 is information having identification numbers (NID) of memory modules 62, which are located on the route from the memory controller 61 to the addressed memory module 62, arranged in sequence from the memory controller 61 end. The NID written at the end of the route information 82 is the NID of the addressed memory module. The route information 82 is not limited to the example in FIG. 8 as long as a route from the memory controller 61 to the addressed memory module can be determined.

Next, packet transmission operations when the memory controller 61 receives an access request from a host are explained. FIG. 9 illustrates an operation flow of a memory controller.

When the memory controller 61 receives an address of an access target together with the access request (S91), the memory controller 61 identifies a memory module 62, a NAND region of which is indicated by the access target address. The memory controller 61 refers to the route map 80 and obtains the route information 82 corresponding to the identified addressed memory module (S92). Next, the memory controller 61 embeds the route information 82 obtained in S92 into the packet and transmits the packet to a memory module 62, which is written first in the route information 82 (S93).

In the present embodiment, the memory controller 61 embeds the route information 82 into a packet when transmitting the packet. However, a structure of packets transmitted/received in the storage device according to the present embodiment is explained next. FIG. 10A illustrates an example of a packet transmitted/received in the storage device according to the present embodiment.

The packet, similarly to a PCIe packet (TLP) illustrated in FIGS. 5A-5C, includes three fields: a TLP header 41, a data payload 42, and a TLP digest 43.

The structure of the TLP header 41 is the same as the TLP illustrated in FIGS. 5A-5C, but data stored in the address field 45 is different.

FIG. 10B illustrates a structure of data stored in the address field 45 of a packet in the present embodiment. The address field 45 includes MM forwarding control information 105 in an upper side and NAND address information 106 in a lower side.

The MM forwarding control information 105 is control information used to cause the memory module 62 that received a packet from an upper port to forward the packet from a lower port. More specifically, the MM forwarding control information 105 stores an output port number of a packet when the PCIe switch in the memory module 62 forwards the packet. A state in which the MM forwarding control information 105 is used is explained later.

NAND address information in the memory module 62 is set to the NAND address information 106. This information is the same as the information in the lower address field 47 in FIG. 5C.

The data payload 42 includes a packet identifier flag 101, a bypass flag 102, route information 103, and NAND write data 104.

The packet identifier flag 101 is information of an identifier indicating whether the packet is a normal packet, a response packet, or an abnormality report packet.

The normal packet is a packet transmitted to a destination address when the memory controller 61 receives an access request, and in a case of this type of packet, an identifier indicating a normal packet is set to the packet identifier flag 101.

The response packet is a packet transmitted when the access target memory module 62 receives a packet and makes a response to the packet, and in a case of this type of packet, an identifier indicating a response packet is set to the packet identifier flag 101.

The defect report packet is a packet transmitted when the memory module 62 detects that a link of a port connected to another memory module 62 is down, and in a case of this type of packet, an identifier indicating a defect report packet is set to the packet identifier flag 101.

The bypass flag 102 is a flag set to cause a packet to bypass when a failure occurs in a packet forwarding route. The bypass flag 102 includes a left bypass flag and a right bypass flag. Details are explained later, but in the present embodiment, a value of either the left bypass flag or the right bypass flag is set depending on the route in which the failure occurred.

The route information 103 is information indicating a route through which a packet is forwarded. The route information 103 stores the route information 82 that the memory controller 61 obtained by referring to the route map 80.

The NAND write data 104 stores data to be written in a NAND.

The TLP digest 43 is the same as the TLP illustrated in FIG. 5A.

In the following descriptions, a packet refers to a packet of the format explained with reference to FIGS. 10A and 10B.

Next, a configuration and operations of the memory modules 62 are explained. FIG. 11 illustrates an example of a configuration of a memory module. Each of the memory modules 62 includes a PCIe switch 111, an NAND controller 112, and a NAND 113.

The PCIe switch 111 performs data forwarding processing. As illustrated in FIG. 11, the PCIe switch has four ports. A port 1, a port 2, and a port 3 are the same as the ports explained in FIG. 6. The port 1 (PT. 1) is connected to a parent node in a network to which the memory modules 62 are connected, and each of the port 2 (PT. 2) and the port 3 (PT. 3) are connected to a child node or a sibling node. A port 0 is connected to the NAND controller 112.

When the PCIe switch 111 receives a packet from a memory module 62 connected to the port 1 or a memory controller 61, the PCIe switch 111 forwards the received packet from the port 0 to the NAND controller 112. When the PCIe 111 switch 111 receives a packet from the port 2 or the port 3, the PCIe switch 111 forwards the received packet from the port 1 to the parent node.

In addition, when the PCIe switch 111 receives a packet from the NAND controller 112 via the port 0, the PCIe switch 111 determines a port from which the packet is output by referring to the packet identifier flag 101 and the MM forwarding control information 105 in the packet. The PCIe switch 111 then outputs the packet from the determined port.

More specifically, when the PCIe switch 111 receives a packet from the NAND controller 112, the PCIe switch 111, first, refers to the packet identifier flag 101 in the received packet.

When the packet identifier flag 101 is set to be an identifier indicating a response packet, the PCIe switch 111 outputs the received packet from the port 1 and forwards the packet to the parent node.

When the packet identifier flag 101 is set to be an identifier indicating an abnormality report packet, the PCIe switch 111 outputs the received packet from the port 1 and forwards the packet to the parent node.

When the packet identifier flag 101 is set to be a value indicating a normal packet, the PCIe switch 111 refers to the MM forwarding control information 105. When the value in the MM forwarding control information 105 is information indicating the port 2, the PCIe switch 111 outputs the received packet from the port 2. When the value in the MM forwarding control information 105 is information indicating the port 3, the PCIe switch 111 outputs the received packet form the port 3.

Next, the NAND controller 112 is explained. The NAND controller 112 has functions of packet forwarding processing, lower port abnormality report processing, and internal error report processing.

In the packet forwarding processing, the NAND controller 112 determines whether the received packet is addressed to the local node or another node, and when the received packet is addressed to the local node, the NAND controller 112 performs internal processing of the received packet, and when the received packet is addressed to another node, the NAND controller 112 performs processing to forward the received packet to another node. In the following descriptions, a particular target node itself is referred to as a local node and nodes other than the target node are referred to as the other node.

In the lower port abnormality report processing, in a case in which an abnormality in the lower port of the PCIe switch 111 is detected (e.g., a link is down), the NAND controller 112 generates a packet to report detection of the abnormality, and transmits the packet to the memory controller 61. Here, the case in which a link of the port of the PCIe switch 111 is down can be, for example, a case in which a failure occurs in a route to which the memory modules 62 are connected or a case in which the other node to which the lower port of the local node is directly connected went down.

In the internal error report processing, in a case in which an internal error occurs, the NAND controller 112 generates a packet to report the error occurrence and transmits the packet to the memory controller 61. The case in which the internal error occurs can be, for example, a case in which a failure occurs in an internal NAND at the time of writing to the NAND and a write error occurs, or a case in which a failure occurs in the PCIe switch at the time of forwarding a packet to the other node and the packet is not forwarded.

Next, the forwarding processing in the NAND controller 112 is explained in detail.

For the forwarding processing, the NAND controller 112 has information to obtain a positional relationship of the local node in the network to which the local node belongs. The NAND controller 112 obtains the positional relationship of the local node in the network by using the NID corresponding to the port number of the PCIe switch. In other words, the NAND controller 112 has information of NIDs of the memory modules 62 each connected to the port 1, the port 2, and the port 3 as a port correspondence table.

Figure 12:
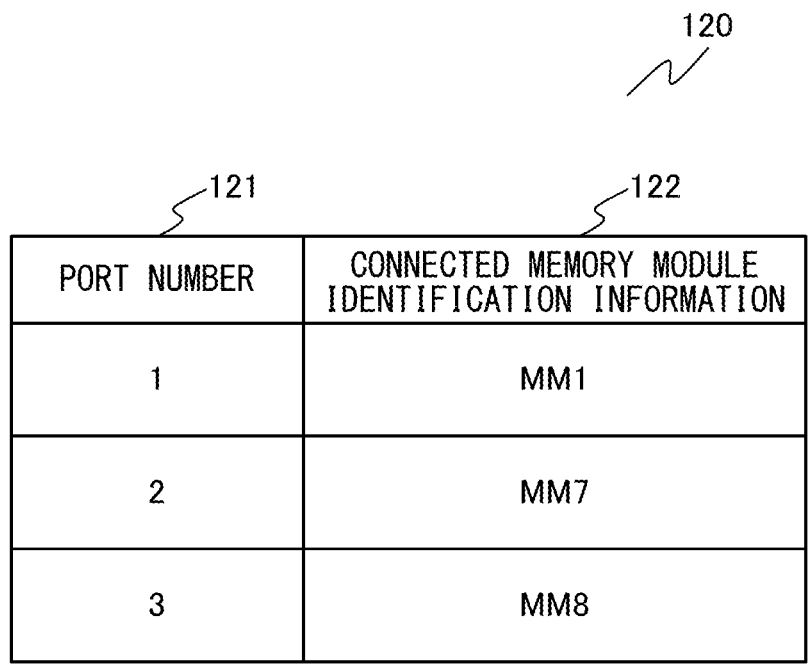
FIG. 12 illustrates an example of a port correspondence table.

FIG. 12 illustrates an example of the port correspondence table. The port correspondence table 120 includes data items of a port number 121 and a connected memory module identification information 122. The port number 121 stores the numbers of ports of the PCIe switch 111 in the memory module 62. The connected memory module identification information 122 stores identification information of the memory modules 62 connected to the ports corresponding to the port number 121. The port correspondence table 120 illustrated in FIG. 12 is an example of a port correspondence table of the MM3 in FIG. 7, and the port corresponding table 120 stores information indicating that the port 1 is connected to a memory module 62 of NID (MM1), the port 2 is connected to a memory module 62 of NID (MM7), and the port 3 is connected to a memory module 62 of NID (MM8).

Figure 14:
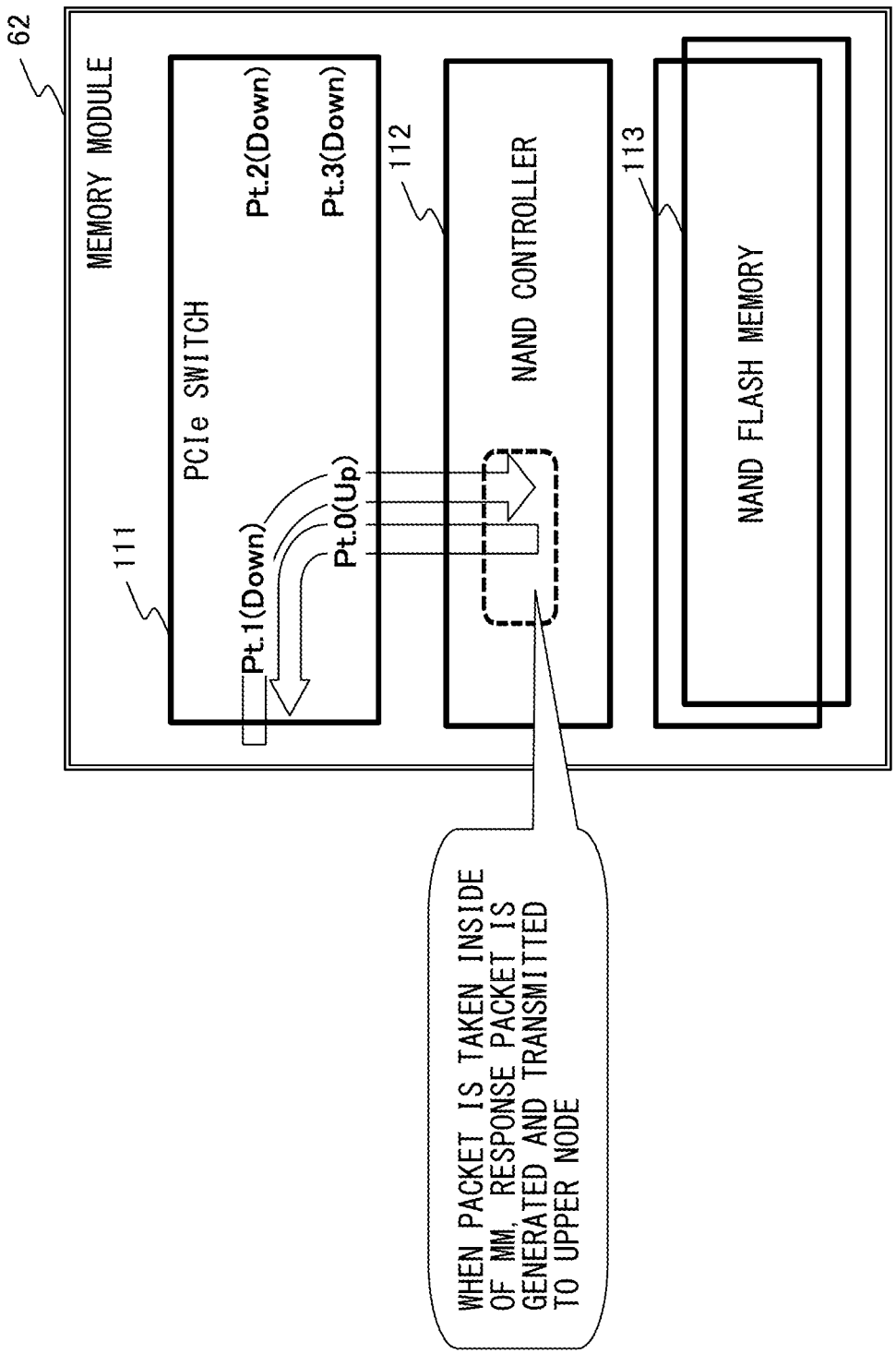
FIG. 14 is a diagram (2) to explain states of the forwarding processing of the NAND controller.

FIG. 13 and FIG. 14 are diagrams to explain states of the forwarding processing of the NAND controller.

As illustrated in FIG. 13, in the packet forwarding processing, the NAND controller 112, first, determines whether or not the packet destination is the local node by referring to the route information 103 included in the received packet.

More specifically, the NAND controller 112 determines whether or not the last node in the route information 103 included in the received packet is the local node. When the last node is the local node, the NAND controller 112 determines that the packet destination is the local node. When the last node is not the local node, the NAND controller 112 determines that the packet destination is the other node.

When the NAND controller 112 determines that the destination of the received packet is the other node, the NAND controller 112 identifies the next addressed memory module and forwards the received packet to the memory module 62 with the identified NID.

In the identification of the next addressed memory module, more specifically, the NAND controller 112 determines a node written subsequent to the local node in the route information 103 included in the received packet to be a forwarding-destination node. For example, when the MM3 receives a packet addressed to the MM7 in FIG. 6, the NAND controller 112 in the MM3 determines the MM7, which is an NID written subsequent to the NID of the local node in the route information 103, to be the forwarding-destination node.

When the forwarding-destination node is identified, the NAND controller 112 obtains the port number of a port corresponding to the forwarding-destination node by referring to the port correspondence table 120.

Next, the NAND controller 112 sets information indicating the obtained port number to the MM forwarding control information 105 of the received packet.

The NAND controller 112 then forwards the packet to which the information is set to the PCIe switch 111. The PCIe switch 111 that received the packet transmits the packet from the port of the port number set in the MM forwarding control information 105.

Here, in the present embodiment, the MM forwarding control information 105 stores information indicating either the port 2 or the port 3 as the packet forwarding-designation port. Therefore, the MM forwarding control information can be a 1-bit Boolean value, for example, and as a result, a large section to designate a local memory address in each memory module 62 can be reserved in the address field 45 of the TLP header 41.

It should be noted that as illustrated in FIG. 13, a packet received from the lower port (the port 2 or the port 3) is transmitted from the upper port (the port 1) without passing through the NAND controller 112.

Also as illustrated in FIG. 13, when the destination of the received packet is determined to be the local node, the NAND controller 112 takes the received packet inside. When the received packet is a write access, for example, the NAND controller 112 writes contents of the packet write data 104 to the address indicated by the NAND address information 106.

In addition, the NAND controller 112, as illustrated in FIG. 14, generates a packet to report that the received packet reached the destination node (hereinafter referred to as a response packet) and responds to the memory controller 61. The response packet can be generated at a point in time at which the write processing is completed. When the received packet is a read access, data to be read is stored in the response packet.

In the transmission processing of the response packet, more specifically, the NAND controller 112, first, generates a new packet and sets an identifier indicating a response packet to the packet identifier flag 101 of the generated packet. The NAND controller 112 then forwards the generated packet to the PCIe switch 111. The packet forwarded to the PCIe switch 111 is output to the parent node from the port 1 in accordance with the processing operations at the time of reception of a response packet and ultimately reaches the memory controller 61. When the packet is received, the memory controller 61 reports the occurrence of an abnormality together with details of the abnormality to a host.

Next, the lower port abnormality report processing of the NAND controller 112 is explained.

When the NAND controller 112 detects an abnormality (e.g., a link is down) in the lower port, the NAND controller 112 generates a packet to report the port abnormality to the memory controller 61 and transmits the port to the memory controller 61.

Figure 15:
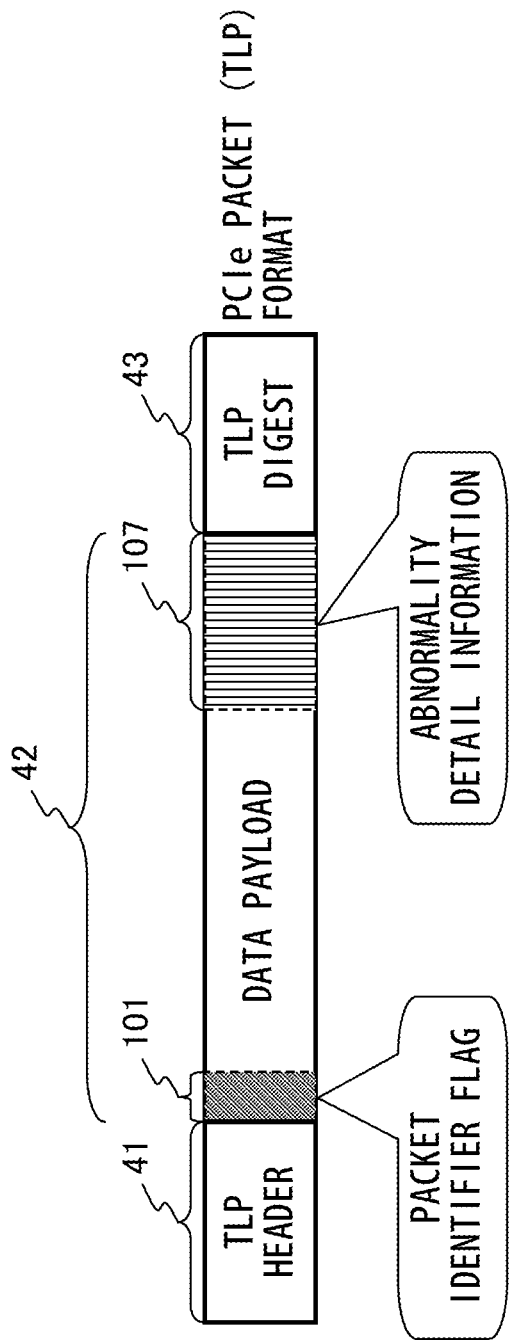
FIG. 15 illustrates an example of a structure of a packet to report an abnormality in the lower port.

FIG. 15 illustrates an example of a structure of a packet to report an abnormality in the lower port (hereinafter referred to as an abnormality report packet). The basic structure of the abnormality report packet is the same as the structure of the packet illustrated in FIGS. 10A and 10B, but a field of abnormality detail information 107 to store details of the abnormality is secured in the data payload 42. In addition, an identifier indicating an abnormality report packet is set to the packet identifier flag 101. It should be noted that no value is set to the bypass flag 102, the route information 103, or the write data 104.

Next, operations of the NAND controller 112 when the lower port abnormality report is detected are explained.

When an abnormality in the lower port is detected, the NAND controller 112 generates a new packet and sets an identifier indicating an abnormality report packet to the packet identifier flag 101 of the generated packet. The NAND controller 112 also stores information indicating details of the detected abnormality in a field of the abnormality detail information 107. As the information indicating details of the abnormality, information of the port number of a port in which a link is down or a memory module 62 connected to the port in which a link is down is stored. The NAND controller 112 forwards the generated packet to the PCIe switch 111. The packet forwarded to the PCIe switch is output to the parent node from the port 1 in accordance with the processing operations at the time of reception of an abnormality report packet and ultimately reaches the memory controller 61. When the packet is received, the memory controller 61 reports an occurrence of an abnormality together with details of the abnormality to the host.

Next, the internal error report processing of the NAND controller 112 is explained.

When the NAND controller 112 detects an internal error at the time of receiving a packet from the parent node, the NAND controller 112 stores information to the effect that an error occurred in a response packet responding to the received packet and transmits a response report packet.

Figure 16:
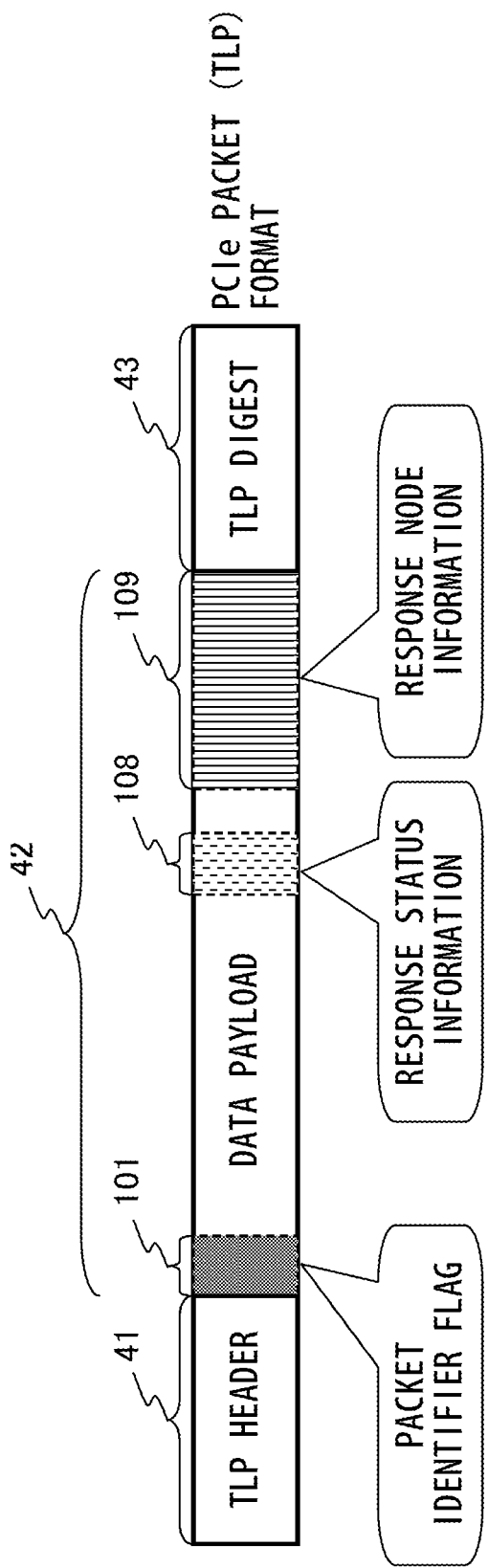
FIG. 16 illustrates an example of a structure of a response report packet to report the occurrence of error.

FIG. 16 illustrates an example of a structure of a response report packet to report the occurrence of error (hereinafter referred to as an abnormal response report packet). The abnormal response report packet basically has the same structure as that of the packet illustrated in FIGS. 10A and 10B, but a field of response status information 108 indicating an occurrence of an abnormality and a field of response node information 109 storing information of a node in which an abnormality occurred are secured in the data payload 42. It should be noted that no values are set to the bypass flag 102, the route information 103, or the write data 104.

Figure 17:
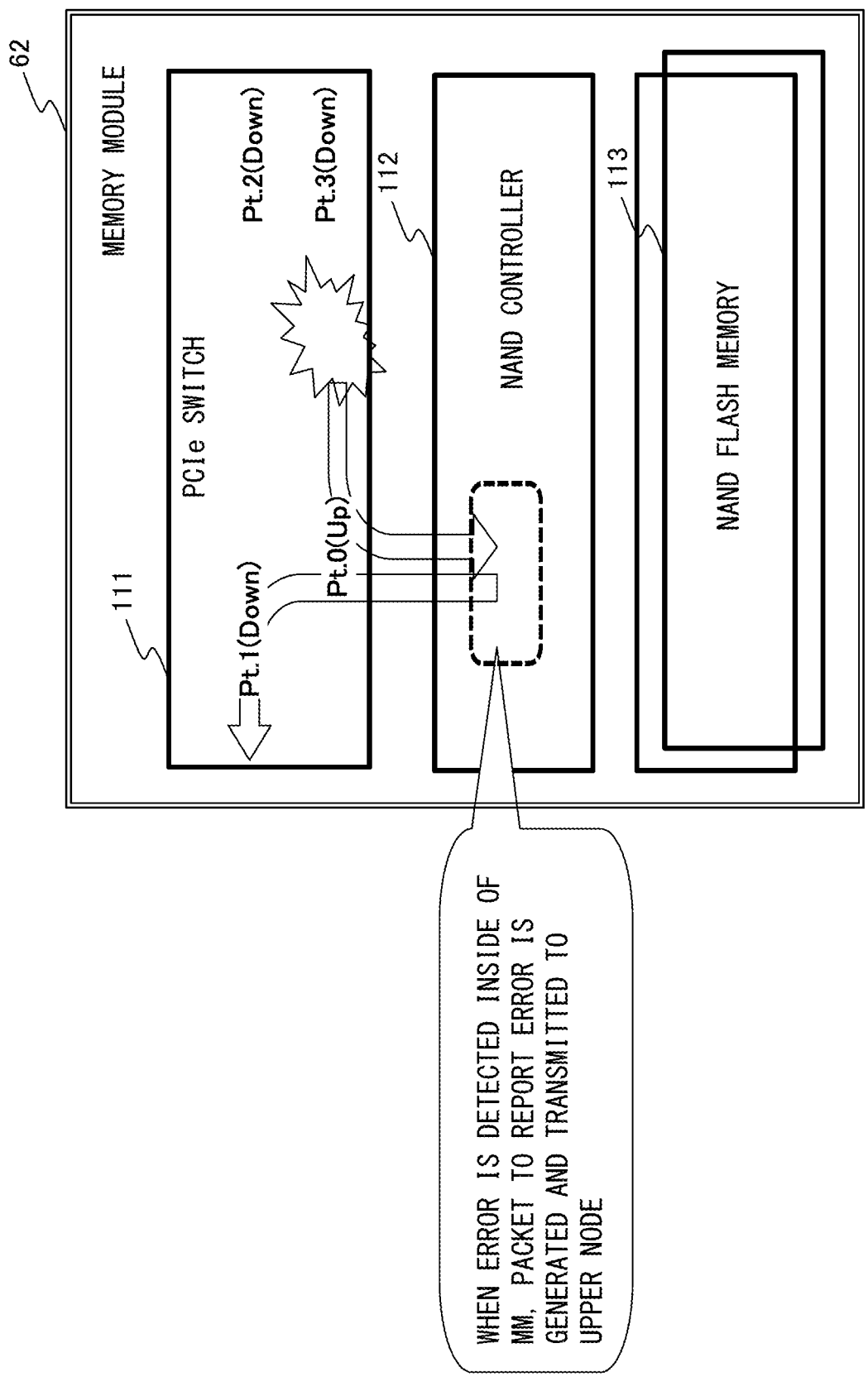
FIG. 17 is a diagram to explain operations of the NAND controller when an internal error occurred.

FIG. 17 is a diagram to explain operations of the NAND controller when an internal error occurred. The example of FIG. 17 is an example in which the memory module 62 receives a packet from the parent node and an error occurred in the PCIe switch 111 when the packet is transmitted from the lower port.

When the NAND controller 112 detects an error in the local node, the NAND controller 112 generates a new packet and sets an identifier indicating a response report packet to the packet identifier flag 101 of the generated packet. The NAND controller 112 also stores information indicating detection of an abnormality in the response status information 108. The response status information 108 is information to determine whether or not an abnormality occurred, and can be a binary flag. The NAND controller 112 moreover stores the identification number (NID) of the local node in the response node information 109.

The NAND controller 112 then forwards the generated packet to the PCIe switch 111. The packet forwarded to the PCIe switch 111 is output from the port 1 and ultimately reaches the memory controller 61. When the packet is received, the memory controller 61 reports the occurrence of an abnormality to the host.

The cases in which an internal error occurs are not limited to the case illustrated in FIG. 17. For example, a case in which a write error occurs at the time of data write processing to a NAND that the local node controls is a possible case.

It should noted that the abnormal response report packet is transmitted at the time of responding to the packet received from the parent node, but the abnormal response report packet can be generated at a timing of detecting an error and can be transmitted to the memory controller 61.

In the present embodiment, when an abnormality occurs in a route between memory modules 62 (PCIe link), packets can be delivered to a destination memory module 62 through a bypass route. FIG. 18 is a diagram to explain a state in which packets are set to go a bypass route when an abnormality occurred in a route between memory modules.

In the example of FIG. 18, a route from the memory controller 61 to the MM5 at normal times goes from the MM0, the MM1, the MM3, to the MM5. In the example of FIG. 18, when a failure occurred in a route between the MM1 and the MM3, the MM1 detects that a link with the port connected to the MM3 is down and transmits an abnormality report packet to the memory controller 61.

At that time, when the MM1 receives a packet addressed to the MM5 from the memory controller 61, the MM1 transmits the packet to the MM5 through a bypass route. In the case of the example of FIG. 18, when the MM1 receives the packet, the MM1 delivers the packet to the MM5 through a route from the MM4, through to the MMx1, the MMz1, the MMy1, and the MM5.

When an abnormality occurs in a route between memory modules 62, in order to make a packet reach a destination memory module through a bypass route as described above, a memory module 62 that detects an abnormality makes a setting to the bypass flag 102 in the received packet. The bypass flag 102 includes a right bypass flag and a left bypass flag, but which bypass flag is set is determined in accordance with a port detecting the abnormality. In other words, when the port detecting the abnormality is the port 2 (a port connected to a node with a smaller identification number from among the ports connected to child nodes), the NAND controller 112 turns on (sets) the left bypass flag. On the other hand, when the port detecting the abnormality is the port 3 (a port connected to a node with a larger identification number from among the ports connected to child nodes), the NAND controller 112 turns on (sets) the right bypass flag. When the left bypass flag is set, the memory module 62 transmits the packet from the port 3 (a lower port in which a failure has not occurred). When the right bypass flag is set, the memory module 62 transmits the packet from the port 2 (a lower port in which a failure has not occurred).

When an abnormality occurs in a route between the memory controller 61 and the memory module 62, the memory controller 61 can set the bypass flag in the same manner as the memory modules 62 and transmit a packet.

When a packet in which a left bypass flag is set is received from an upper port, a memory module 62 transmits the received packet from the port 2 (a port connected to a node with a smaller identification number from among the ports connected to child nodes). When a packet in which a right bypass flag is set is received from an upper port, a memory module 62 transmits the received packet from the port 3 (a port connected to a node with a larger identification number from among the ports connected to child nodes).

The example of FIG. 18 is an example in which an abnormality occurred in a route between memory modules, but the same operations as those in FIG. 18 are performed when an abnormality occurs in a memory module 62 itself and a packet cannot be delivered through a route indicated in the route information 103.

Next, a state in which a packet to which a left bypass flag is set is forwarded and a state in which a packet to which a right bypass flag is set is forwarded are explained with reference to FIG. 19 and FIG. 20.

Figure 19:
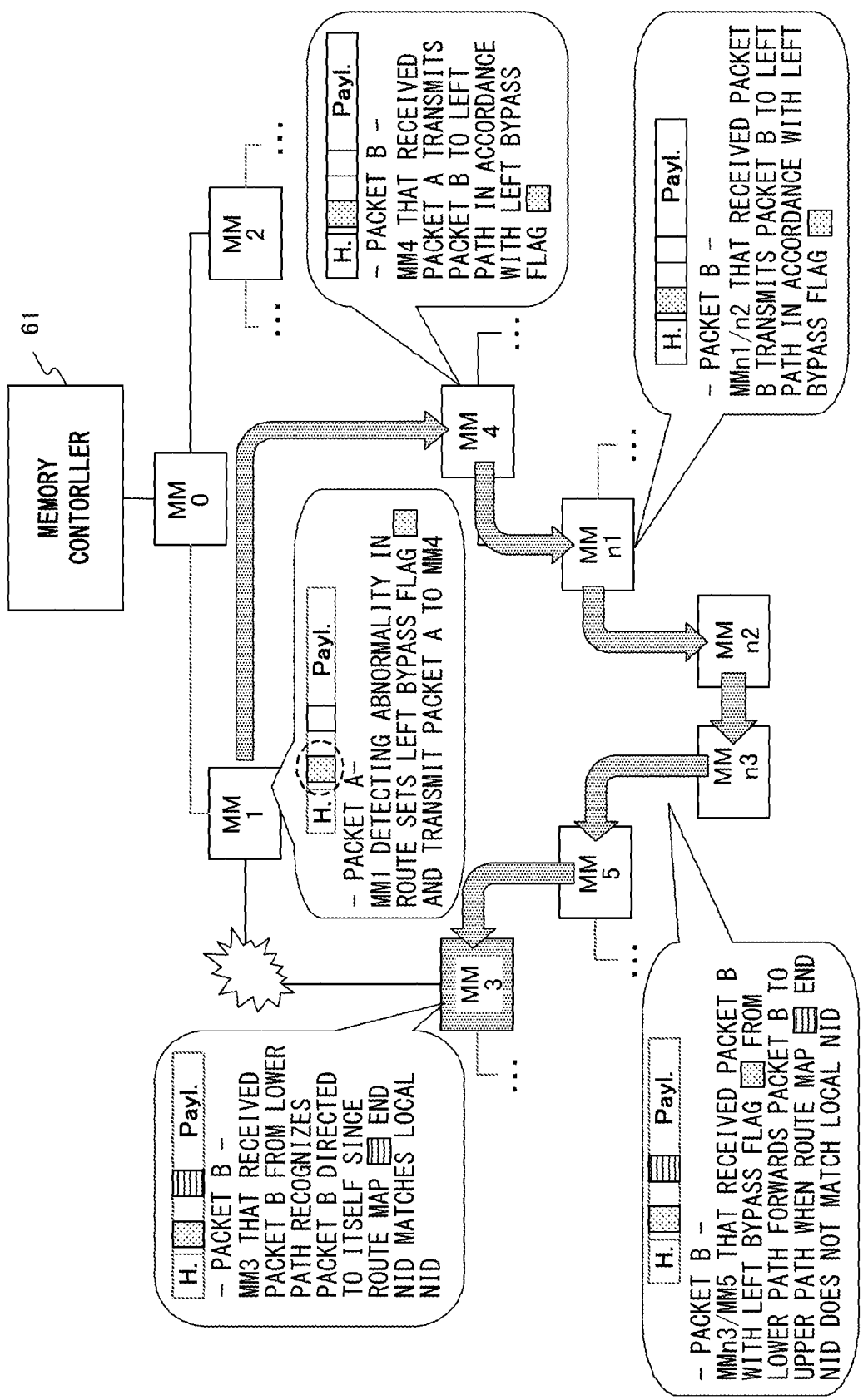
FIG. 19 is a diagram to explain a state in which a packet to which a left bypass flag is set is forwarded.

FIG. 19 is a diagram to explain a state in which a packet to which a left bypass flag is set is forwarded.

FIG. 19 illustrates an example in which a failure occurs in a route between the MM1 and the MM3. Since the route between the MM1 and the MM3 in which a failure occurred is connected to the port 2 of the MM1, when the MM1 receives a packet from its upper node, the MM1 sets a left bypass flag to the packet. The MM1 then forwards the packet to the MM4 from the port 3, which is a lower port in which the failure has not occurred.

The MM4 that received the packet forwarded from the MM1 through the upper port checks whether or not a left bypass flag or a right bypass flag is set to the received packet. In the example of FIG. 19, the MM4 confirms that a left bypass flag is set to the received packet. The MM4 then transmits the packet from the port 2 in accordance with the left bypass flag. Ina similar manner, the MMn1 and the MMn2 that received a packet through the respective upper port transmit the packet from the respective port 2 in accordance with the left bypass flag.

The MMn3 that received the packet forwarded from the MMn2 through the lower port checks the destination of the packet by referring to the route information 103 of the packet. In other words, the MMn3 checks whether or not the NID written at the end matches the NID of the local node by referring to the route information 103 of the received packet. Since the destination of the packet is the MM3 in the case of the example in FIG. 19, the NID written at the end of the route information 103 is the NID of the MM3. In this manner, the MMn3 confirms that the destination of the received packet is the other node. The MMn3 then transmits the packet from the upper port. The MM5 performs the same operations as those in the MMn3.

The MM3 that received the packet forwarded from the MM5 through the lower port checks the destination of the packet by referring to the route information 103 of the packet. In other words, the MM3 checks whether or not the NID written in at the end matches the NID of the local node by referring to the route information 103 of the received packet. In the example in FIG. 19, the MM3 confirms that the destination of the packet is the local node and internally processes the packet.

Figure 20:
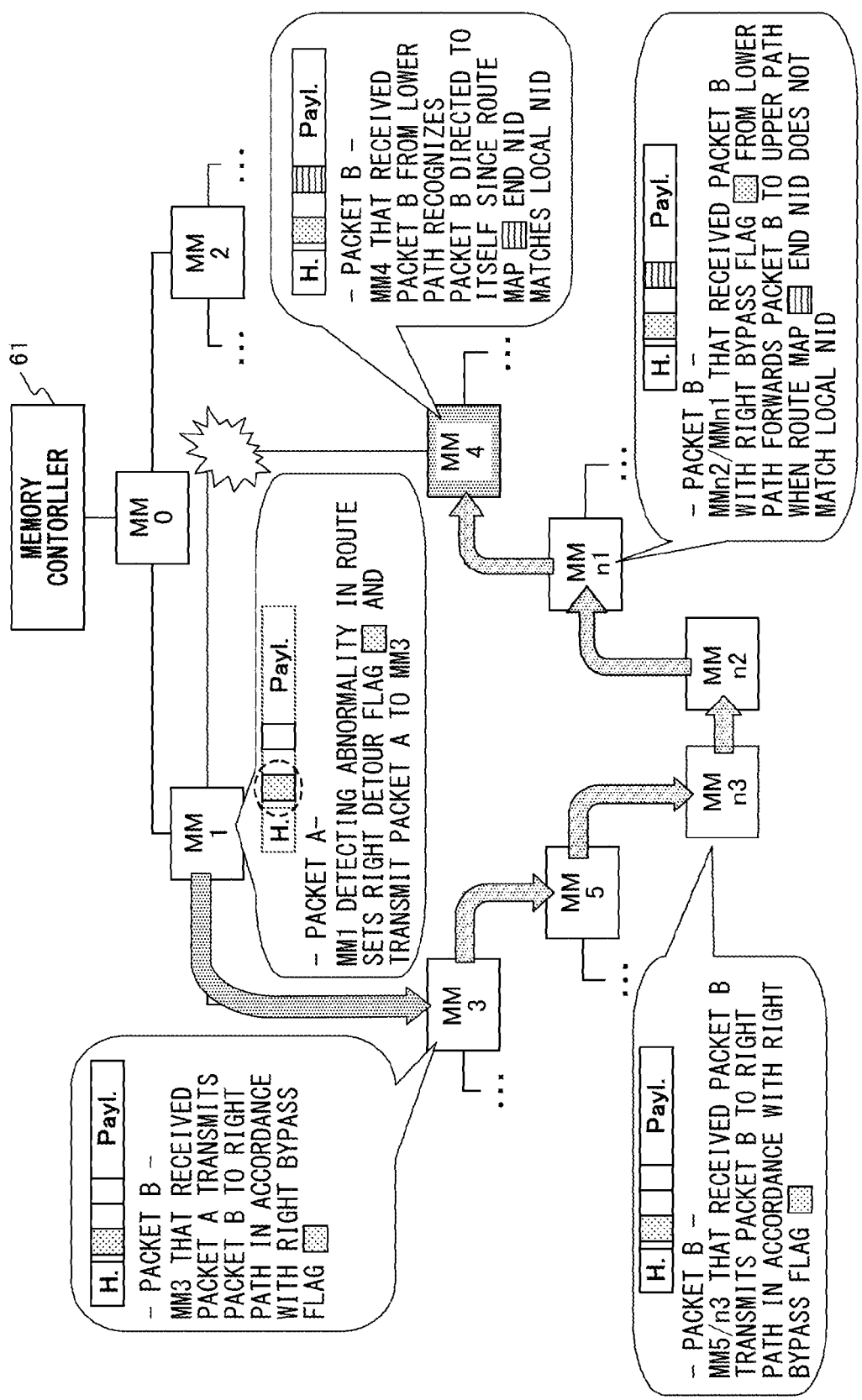
FIG. 20 is a diagram to explain a state in which a packet to which a right bypass flag is set is forwarded.

FIG. 20 is a diagram to explain a state in which a packet to which a right bypass flag is set is forwarded.

FIG. 20 illustrates an example in which a failure occurs in a route between the MM1 and the MM4. Since the route between the MM1 and the MM4 in which a failure occurred is connected to the port 3 of the MM1, when the MM1 receives a packet from its upper node, the MM1 sets a right bypass flag to the packet. The MM1 then forwards the packet to the MM3 from the port 2, which is a lower port in which the failure has not occurred.

The MM3 that received the packet forwarded from the MM1 through the upper port checks whether or not a left bypass flag or a right bypass flag is set to the received packet. In the example of FIG. 20, the MM3 confirms that a right bypass flag is set to the received packet. The MM3 then transmits the packet from the port 3 in accordance with the right bypass flag. In a similar manner, the MM5 and the MMn3 that received a packet through the respective upper port transmit the packet from the respective port 3 in accordance with the right bypass flag.

The MMn2 that received the packet forwarded from the MMn3 through the lower port checks the destination of the packet by referring to the route information 103 of the packet. In other words, the MMn2 checks whether or not the NID written at the end matches the NID of the local node by referring to the route information 103 of the received packet. Since the destination of the packet is the MM4 in the case of the example in FIG. 20, the NID written at the end of the route information 103 is the NID of the MM4. In this manner, the MMn2 confirms that the destination of the received packet is the other node. The MMn2 then transmits the packet from the upper port. The MMn1 performs the same operations as those in the MMn2.

The MM4 that received the packet forwarded from the MMn1 through the lower port checks the destination of the packet by referring to the route information 103 of the packet. In other words, the MM4 checks whether or not the NID written in at the end matches the NID of the local node by referring to the route information 103 of the received packet. In the example in FIG. 20, the MM4 confirms that the destination of the packet is the local node and internally processes the packet.

Although it is explained in the descriptions of FIG. 13 etc. that a packet received from a lower port is forwarded from the port 1 without passing through the NAND controller 112, when a bypass route is taken, processing is to be performed in the NAND controller 112 as explained in FIG. 19 and FIG. 20. Therefore the packet received from the lower port is forwarded from the port 0 to the NAND controller 112, and determination processing is performed in the NAND controller 112 as to whether or not the packet is addressed to the local node.

As explained in the descriptions of FIG. 19 and FIG. 20, by causing a packet to take a bypass by using a bypass flag, even if an abnormality occurs on the transmission route of a packet, the packet can be delivered to the destination node by causing the packet to take a bypass by using a general-purpose protocol.

Next, an operation flow of memory modules 62 at the time of receiving a packet is explained with reference to FIG. 21 and FIG. 22.

Figure 21:
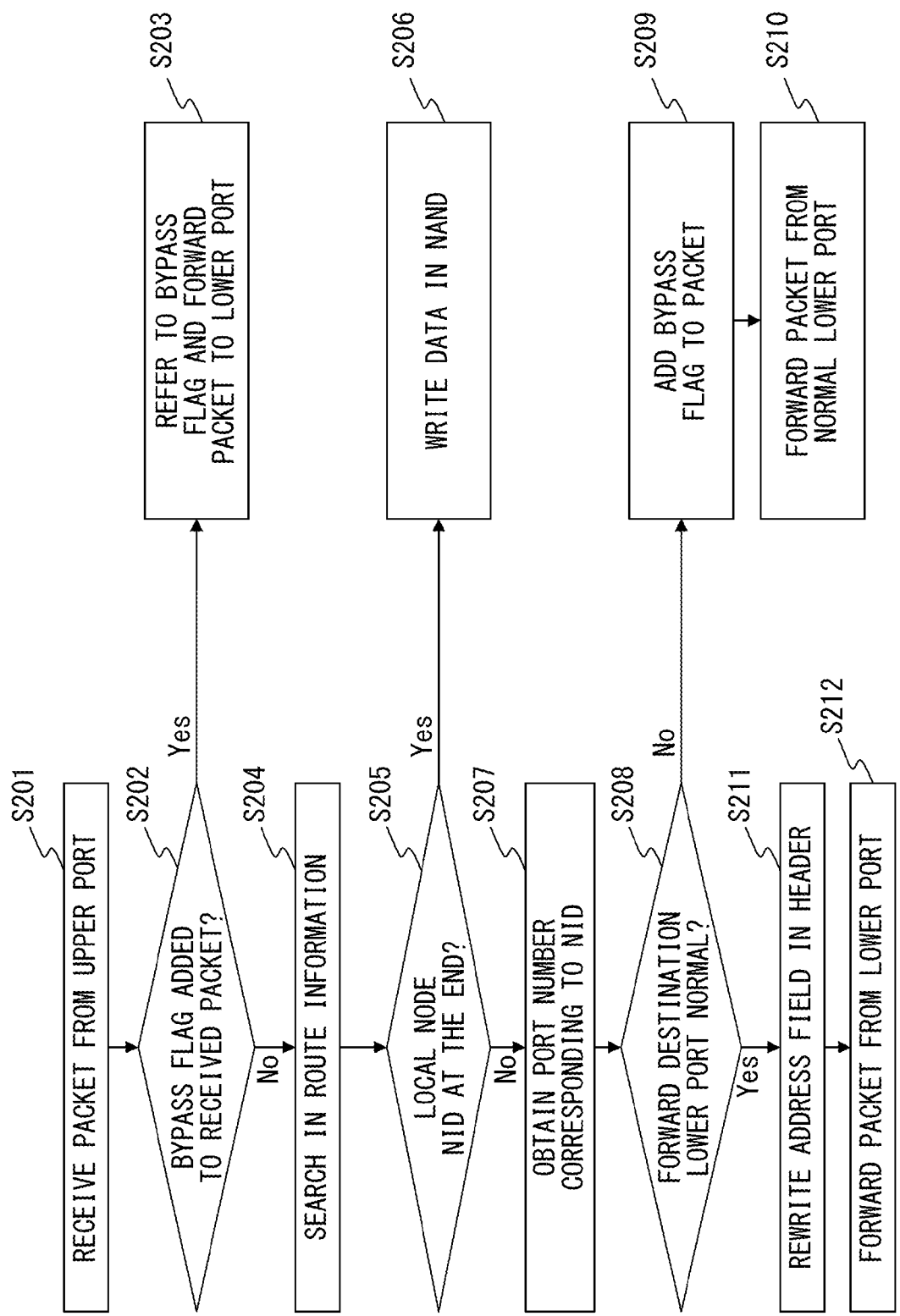
FIG. 21 illustrates an operation flow of a memory module at the time of receiving a packet from an upper port.

FIG. 21 illustrates an operation flow of a memory module at the time of receiving a packet from an upper port.

When a memory module 62 receives a packet from its upper port (S201), the memory module 62 checks whether or not either a left bypass flag or a right bypass flag is set in the received packet (S202). When the left bypass flag or the right bypass flag is set (Yes in S202), the memory module 62 identifies a port to transmit the packet from among the lower ports in accordance with the bypass flag, and transmits the packet from the identified port (S203).

When neither the left bypass flag nor the right bypass flag is set in the received packet in S202 (No in S202), the memory module 62 searches in the route information 103 of the packet (S204). The memory module 62 then checks whether or not the NID written at the end of the route information 103 matches the NID of the local node (S205). When the NID written at the end of the route information 103 matches the NID of the local node (Yes in S205), the memory module 62 writes the data of the received packet to the NAND that the local node manages (S206). When the writing of the packet data is completed, the memory module 62 generates a response packet and reports the writing to the memory controller 61.

In S205, when the NID written at the end of the route information 103 does not match the NID of the local node (No in S205), the memory module 62 obtains an NID written subsequent to the NID of the local node in the route information 103. The memory module 62 then obtains a port number corresponding to the obtained NID by referring to the port correspondence table 120 (S207).

Next, the memory module 62 determines whether or not the port of the port number obtained in S207 is normal (S208). When an abnormality is found in the port (No in S208), the memory module 62 sets a left bypass flag or a right bypass flag in accordance with the abnormal port number (S209). The memory module 62 then forwards the packet in which a bypass flag is set from a normal lower port (S210).

When there are no abnormalities in the port in S208 (Yes in S208), the memory module 62 rewrites the address field 45(S211). In other words, the memory module 62 sets the port number obtained in S207 to the MM forwarding control information 105 of the address field in the header section. The memory module 62 then forwards the packet from the lower port based on the information in the MM forwarding control information 105 set in S211 (S212).

It should be noted that S208 can be processing to determine whether or not the node connected to the port of the port number obtained in S207 is normal. When a node abnormality is detected in S208 for the first time, the memory module 62 can generate an abnormality response report packet and can transmit the generated abnormality response report packet from the port 1 to the memory controller 61.

FIG. 22 illustrates an operation flow of a memory module at the time of receiving a packet from a lower port when a packet bypass is taken at the time of an abnormality occurrence.

When the memory module 62 receives a packet from a lower port (S221), the memory module 62 checks whether or not an identifier indicating a normal packet is set to the value of the packet identifier flag 101 in the received packet (S222).

In S222, the identifier indicating a normal packet is not set to the packet identifier flag 101 of the received packet (No in S222), and the memory module 62 transmits the packet from the upper port to the parent node (S227).

In S222, when the identifier indicating a normal packet is set to the packet identifier flag 101 of the received packet (Yes in S222), the memory module 62 checks whether or not a left bypass flag or a right bypass flag is set to the bypass flag 102 of the received packet (S223).

In S223, when neither the left bypass flag nor the right bypass flag is set to the received packet (No in S223), the memory module 62 transmits the packet from the upper port to the parent node (S227).

In S223, when either the left bypass flag or the right bypass flag is set to the received packet (Yes in S223), the memory module 62 searches in the route information 103 of the packet (S224). The memory module 62 then checks whether or not the NID written at the end of the route information 103 matches the NID of the local node (S225).

When the NID written at the end of the route information 103 matches the NID of the local node (Yes in S225), the memory module 62 writes data in the received packet to the NAND memory that the local node manages (S226). When the writing of the packet data is completed, the memory module 62 generates a response packet and reports the writing to the memory controller 61.

In S225, when the NID at the end of the route information 103 does not match the NID of the local node (No in S225), the memory module 62 transmits the packet from the upper port to the parent node (S227).

It should be noted that because FIG. 21 and FIG. 22 describe an example of packets at the time of write access, data is written in S206 and S226. However, in the case of packets at the time of read access, data read is performed.

Figure 23:
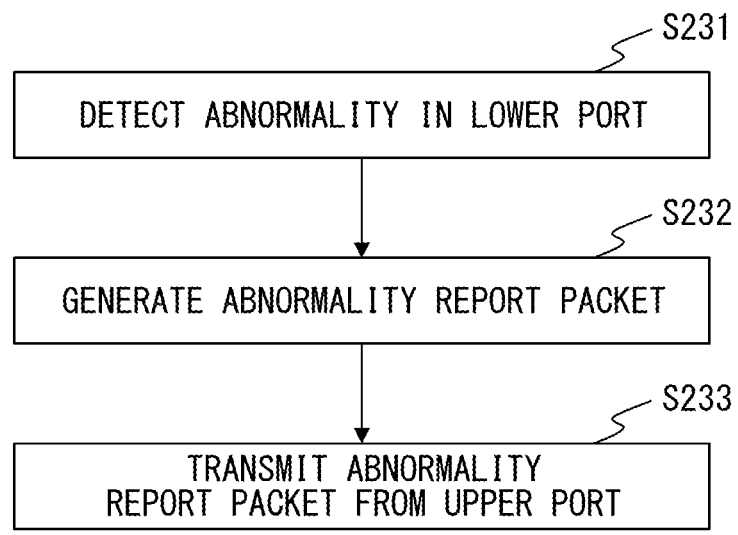
FIG. 23 illustrates an operation flow of a memory module at the time of detecting an abnormality in a lower port.

FIG. 23 illustrates an operation flow of a memory module at the time of detecting an abnormality in the lower port.

When a memory module 62 detects an abnormality in a lower port (S231), the memory module 62 generates an abnormality report packet (S232). The memory module 62 then transmits the generated abnormality report packet from the upper port to the memory controller 61 (S233).

Figure 24:
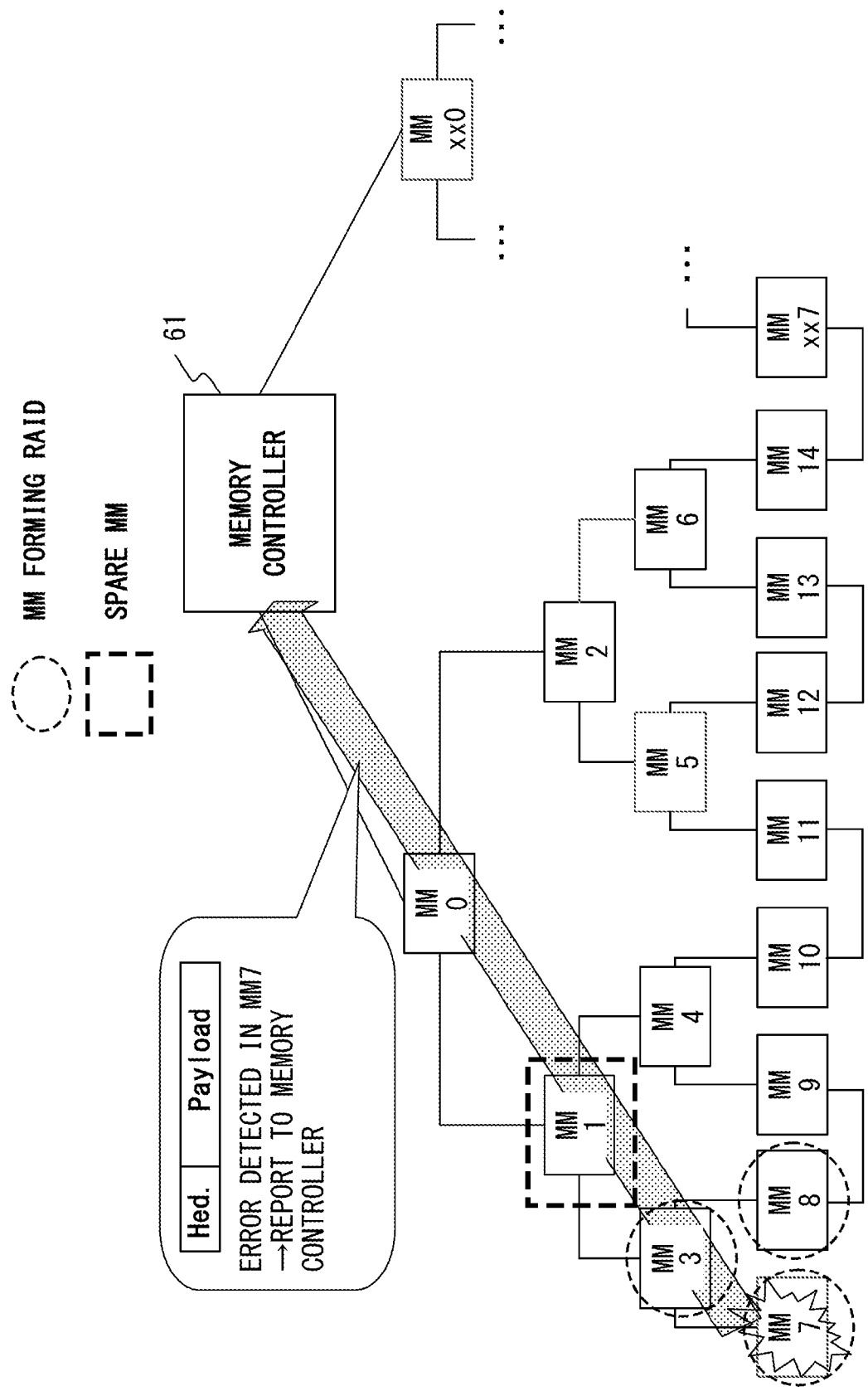
FIG. 24 illustrates an example of a connection configuration in which plural memory modules set up a RAID.

In preparation for a failure that will occur in the memory modules 62, by setting up a RAID (Redundant Arrays of Inexpensive Disks) in plural memory modules 62, reliability and availability of a storage device can be improved. FIG. 24 illustrates an example of a connection configuration in which plural memory modules set up a RAID.

FIG. 24 illustrates an example in which a RAID group is formed of the MM3, the MM7, and the MM8, and the MM1 serves as a spare when a failure occurs in the memory module included in the RAID. The memory controller 61 has information of the memory modules 62 forming the RAID (hereinafter referred to as RAID configuration information). The RAID configuration information includes information such as a set of identification information of the memory modules 62 forming the RAID and identification information of a spare memory module 62 corresponding to the RAID. Here, the RAID can be set to be formed of various memory modules 62. For example, a RAID can be formed of the MM4, the MM9, and the MM10, with the MM1 set to be a spare memory module 62.

Next, operations when a failure occurs in a memory module 62 are explained. When a failure in a memory module (MM7) is detected, the MM7 or the MM3 transmits an abnormality report packet or an abnormality response report packet addressed to the memory controller 61.

When the memory controller 61 receives the abnormality report packet or the abnormality response report packet, the memory controller 61 identifies the memory module 62 in which the failure occurred by referring to the abnormality detail information 107 or the response node information 109. In the example of FIG. 24, the memory controller 61 identifies the MM7 as the node in which the abnormality occurred. The memory controller 61 then refers to the RAID configuration information and obtains the identification information of the spare memory module 62 corresponding to the memory module 62 in which the failure occurred. In the example of FIG. 24, the memory controller 61 obtains that the identification information of the spare memory module is the MM1. The memory controller 61 then switches the memory module 62 in which a failure occurred to the memory module of the obtained identification information.

Figure 25:
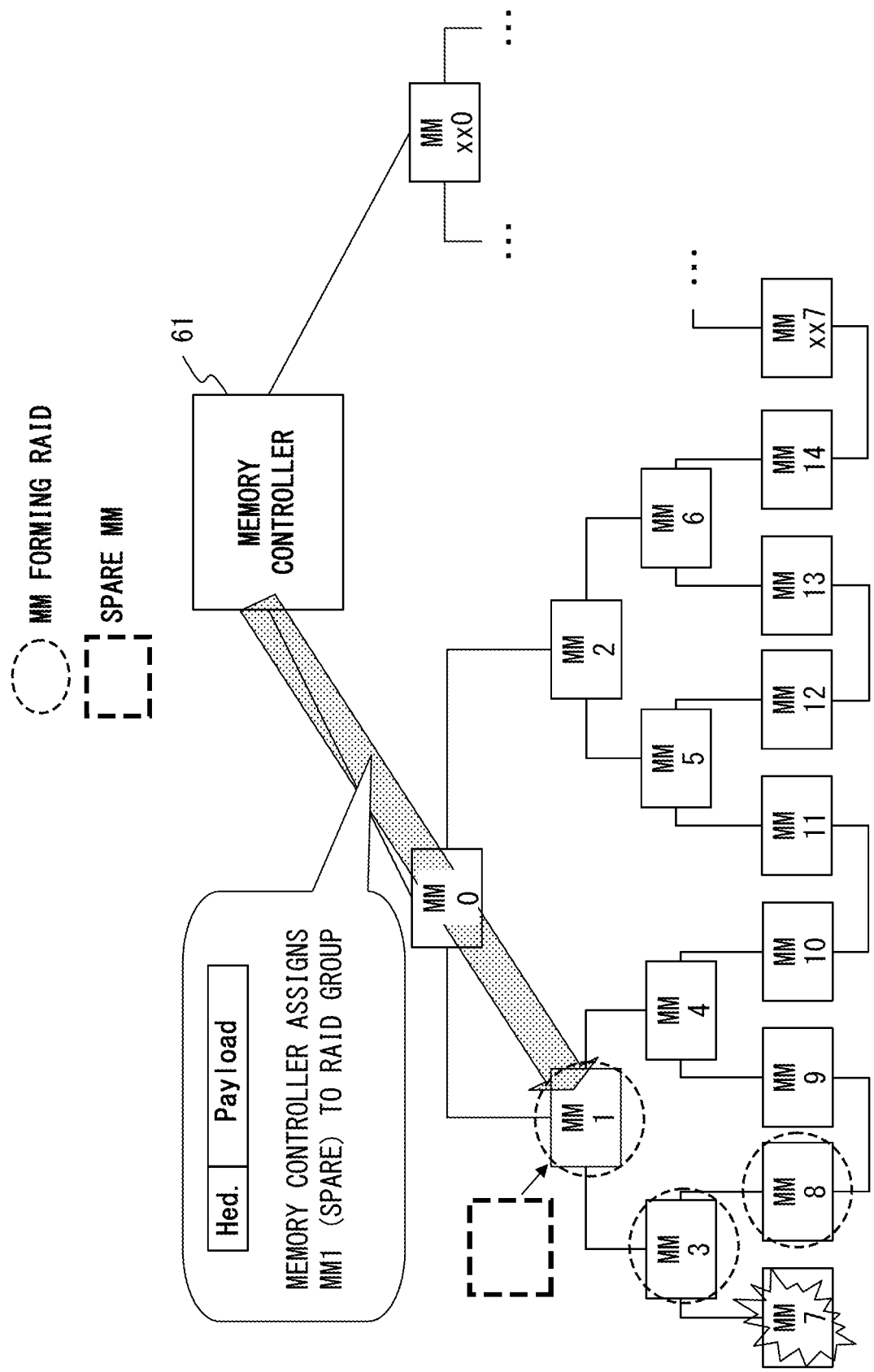
FIG. 25 illustrates an example of the configuration after switching the memory modules.

FIG. 25 illustrates an example of the configuration after switching the memory modules. In FIG. 25, the MM1 is assigned to the RAID group, and the MM1, the MM3, and the MM8 form a new RAID group. Regarding an instruction to switch memory modules, switching of RAID groups can be carried out using a general-purpose protocol by embedding a switch instruction into the data payload 42 of the packet illustrated in FIGS. 10A and 10B.

Although operations to switch the memory modules 62 are different depending on the types of the formed RAID, various methods are employed such as a method of restoring data stored in a node in which a failure occurred from parity information and writing the data to a spare node. At the time of switching the RAID configurations, the memory controller 61 carries out processing to change the setting so that the address of the memory module 62 in which a failure occurred corresponds to the address of the spare memory module 62.

FIG. 26 illustrates an example of a hardware configuration of the memory controller 61 and the NAND controller 112 according to the present embodiment. The memory controller 61 and the NAND controller 112 each include a processor 261, a memory 262, a communication interface 263, and an input/output unit 262. It should be noted that the processor 261, the memory 262, the communication interface 263, and the input/output unit 264 are connected to one another via, for example, a bus 265.

The processor 261 executes a program in which procedures of the above-described flowcharts are written by using the memory 262. The processor 261 provides some or all of the functions of the first transmitter unit 405, a receiver unit 406, the determination unit 408, the first setting unit 409, the second transmitter unit 410, the detector unit 411, the second setting unit 412, and the abnormality report generator unit 413.

The memory 262 is a semiconductor memory, for example, and is formed to include a RAM (Random Access Memory) region and a ROM (Read Only Memory) region. In the memory controller 61, the route map 80 and the RAID configuration information are stored in the memory 262. In the NAND controller 112, the identification information of the local node and the port correspondence table are stored in the memory 262. The memory 262 provides some or all of the functions of the first storage unit 404 and the second storage unit 407.

The communication interface 263 transmits/receives packets through a network in accordance with an instruction from the processor 261. In the memory controller 61, the communication interface 263 corresponds to an interface connecting a port and a host connected through PCIe. In the NAND controller 112, the communication interface 263 corresponds to a port connected through PCIe.

The input/output unit 264 is equivalent to a device to set a route map 80 in the memory controller 61. The input/output unit 264 is equivalent to a device to set identification numbers and a port correspondence table 120 in the NAND controller 112. It should be noted that the input/output unit 264 can be omitted.

Information processing programs to realize the present embodiment are provided to the memory controller 61 or the NAND controller 112 in the following forms as examples:
(1) Installed in advance into the memory 262; or
(2) provided from a host via a network.

The present embodiment is not limited to the above-described embodiments, but can take various structures or embodiments without departing from the gist of the present embodiment.

In the present embodiment, the general-purpose protocol is not limited to PCIe, but other general-purpose protocols can be used.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A storage device comprising:
a controller device configured to transmit communication information to which route information is added, the route information indicating a route to a destination of the communication information and including an address of a relay point that the communication information passes through before reaching the destination of the communication information; and
a memory device configured to receive the communication information, and to transmit the communication information to a next relay point, when the destination of the communication information is not the memory device, by using the address of the relay point included in the route information of the communication information, the memory device including:
a second storage unit configured to store correspondence information that is information associating identification information of another memory device connected to the memory device with a port number connected to the another memory device; and
a processor that executes a procedure including:
receiving the communication information in which the route information is added to a payload section;
determining whether or not the communication information is addressed to the memory device based on the route information;
obtaining from the correspondence information a port number corresponding to identification information of the next relay point included in the route information when it is determined that the communication information is not addressed to the memory device and setting the obtained port number to a header section of the communication information; and
transmitting the communication information from a port corresponding to the port number set to the header section.

2. The storage device according to claim 1, wherein the controller device includes:
a first storage unit configured to store the route information; and
a first transmitter unit configured to add the route information to a payload section of the communication information and to transmit the communication information.

3. The storage device according to claim 1, wherein the procedure further includes:
detecting that an abnormality occurred in the next relay point or a route to the next relay point;
setting bypass information to cause the communication information to bypass to the payload section of the communication information when the abnormality is detected; and
changing a port from which the communication information is transmitted when the bypass information is set to the communication information.

4. The storage device according to claim 1, wherein the changing changes a port from which the communication information is transmitted in accordance with the bypass information and a port from which the receiver unit received the communication information when the bypass information is set to the communication information.

5. The storage device according to claim 1, wherein the procedure further includes:
generating the communication information when the abnormality is detected and to store in a payload section of the generated commutation information abnormality information indicating that the abnormality occurred, and
changing a port from which the communication information is transmitted when the abnormality information is stored in the communication information.

6. The storage device according to claim 1, wherein the controller device and a plurality of the memory devices are connected in such a connection configuration that in a graph in which an identification number is assigned to each node of a binary tree in a breadth-first search order and leaf nodes that have a difference in the identification information of 1 and that do not have an identical parent node are connected, the controller device is allocated to a root node of the binary tree, and each of the plurality of memory nodes is allocated to each node other than the root node.

7. The storage device according to claim 1, wherein the communication information complies with PCI Express standard.

8. A memory device comprising:
a memory;
a processor configured to receive communication information to which route information is added, and to transmit the communication information to a next relay point, when a destination of the communication information is not the memory device, by using an address of a relay point included in the route information of the communication information, the route information indicating a route to the destination of the communication information and including the address of the relay point that the communication information passes through before reaching the destination of the communication information; and a storage unit configured to store correspondence information that is information associating identification information of another memory device connected to the memory device with a port number connected to the another memory device, wherein the processor executes a procedure including:
- receiving the communication information in which the route information is added to a payload section;
- determining whether or not the communication information is addressed to the memory device based on the route information;
- obtaining from the correspondence information a port number corresponding to identification information of the next relay point included in the route information when it is determined that the communication information is not addressed to the memory device and setting the obtained port number to a header section of the communication information; and
- transmitting the communication information from a port corresponding to the port number set to the header section.

9. A control method comprising:
- transmitting by a controller device communication information to which route information is added, the route information indicating a route to a destination of the communication information and including an address of a relay point that the communication information passes through before reaching the destination of the communication information; and
- by a memory device, receiving the communication information, and transmitting the communication information to a next relay point, when the destination of the communication information is not the memory device, by using the address of the relay point included in the route information of the communication information, wherein the memory device:
- receives the communication information in which the route information is added to a payload section;
- determines whether or not the communication information is addressed to the memory device based on the route information;
- obtains from correspondence information, which is information associating identification information of another memory device connected to the memory device with a port number connected to the another memory device and which is stored in a storage unit that is included in the memory device, a port number corresponding to identification information of the next relay point included in the route information when it is determined that the communication information is not addressed to the memory device;
- sets the obtained port number to a header section of the communication information; and
- transmits the communication information from a port corresponding to the port number set to the header section.

10. A control method according to claim 9, wherein
the controller device adds the route information to a payload section of the communication information and transmits the communication information.

* * * * *